United States Patent [19]

Yamakawa

[11] Patent Number: 4,716,540
[45] Date of Patent: Dec. 29, 1987

[54] MULTI-FUNCTIONAL FUZZY LOGIC CIRCUIT

[75] Inventor: Takeshi Yamakawa, Nishigoshi, Japan

[73] Assignee: Omron Tateisi Electronics Co., Kyoto, Japan

[21] Appl. No.: 751,447

[22] Filed: Jul. 3, 1985

[30] Foreign Application Priority Data

Jul. 6, 1984 [JP] Japan ............................... 59-141250
Jul. 6, 1984 [JP] Japan ............................... 59-141251
Jul. 6, 1984 [JP] Japan ............................... 59-141252

[51] Int. Cl.$^4$ ............................................. H03K 19/00
[52] U.S. Cl. ..................................... 364/807; 307/201
[58] Field of Search ....................... 364/807, 602, 773; 307/201, 465

[56] References Cited

U.S. PATENT DOCUMENTS

| | | | |
|---|---|---|---|
| 3,394,266 | 7/1968 | Marten et al. | 307/230 X |
| 4,338,527 | 7/1982 | Nagano | 307/494 |
| 4,558,236 | 12/1985 | Burrows | 307/465 |
| 4,620,188 | 10/1986 | Sengchanh | 307/465 X |

OTHER PUBLICATIONS

Yamakawa et al: "Programmable Multifunction Fuzzy Logic Circuit with Voltage Mode", Denki Yon Gakkai Kyushu Shibu Rengokai Taikai Ronbunshu, P259/Oct. '80, abstract only.
Yamakawa et al, "Membership Function (S/Z Functions) Circuit of Fuzzy Logic-Denki Yon Gakkai Kyushu Shibu Rengokai Taikai Ronbunshu, p. 286, Oct. 81, abstract only.
Miki et al, "The Fuzzy Logic Semi-Custom IC Fabricate by Using the Standard p-MOS Process", Trans. IECI of Japan, vol. J67C, No. 7, P600-601, Jul. 84; abstract only.
Miki et al, "Basic Fuzzy Logic Circuit Formed by Using p-MOS Current Mirror Circuits", Trans. IECE of Japan, vol. J67C, No. 12, P1022-1029, Dec. '84; abstract only.
Yamakawa, "CMOS Multivalued Arithmetic Logic Circuits in Hybrid Mode", note on Multiple-Valued Logic in Japan, vol. 3, No. 5/P5-1/5-10, Feb. 85; abstract only.
Miki et al, "The Design & Fabrication of the Current Mode Fuzzy Logic Semi-Custom IC in the Standard DMOS IC Technology, IEEE Procdgs, 15th Intern'l Symposium on Multiple-Valued Logic, abstract only.
IECE of Japan, Part E, vol. E 64, No. 2-Feb. 81; T. Yamakawa et al, "Implementation of Fuzzy Logic Circuits and a Programmable, Multifunction Circuit with Current Mode", abstract only.
IECE of Japan, vol. 63E, No. 10, Oct. '80; Yamakawa et al, "Implementation of Fuzzy Logic, p. 790, abstract only.
Vol. J63-C, No. 10, pp. 722-723, "Construction of a Programmable Multifunction Voltage Mode Fuzzy Logic Circuit-FIG. 1a, abstract only.
IECE of Japan, Part C, vol. J67C, No. 12, Dec. '84; Yamakawa et al, "Basic Fuzzy Logic Circuit Formed by Using p-MOS Current Mirror Circuits P, (abstract only).

Primary Examiner—Jerry Smith
Assistant Examiner—Charles B. Meyer
Attorney, Agent, or Firm—Stevens, Davis, Miller & Mosher

[57] ABSTRACT

A multi-functional fuzzy logic circuit comprises at least one input circuit provided for at least one input current for producing at least one output current of the same value in the same direction as the input current and at least one output current of the same value in the reverse direction, and a plurality of fuzzy logic circuits for executing different fuzzy logic operations, each of the fuzzy logic circuits having as its input at least one of said output currents produced by said input circuit.

7 Claims, 44 Drawing Figures

FIG. I(A)
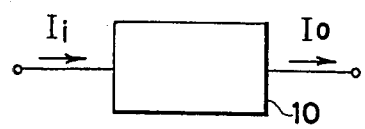
FIG. I(B)
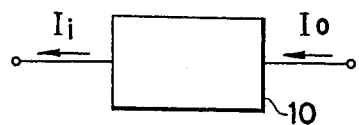
FIG. I(C)
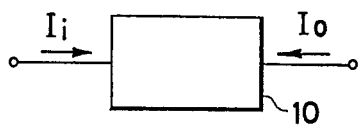
FIG. I(D)
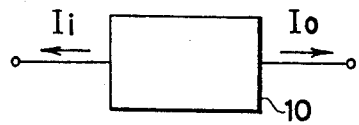

FIG.5(A)
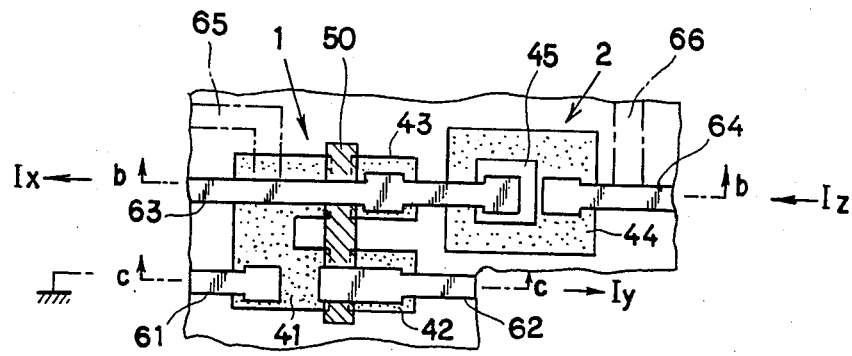
FIG.5(B)
FIG.5(C)
FIG.6
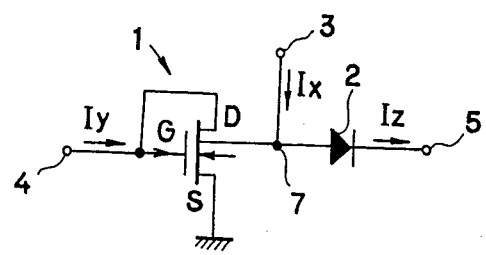

MULTI-FUNCTIONAL FUZZY LOGIC CIRCUIT

BACKGROUND OF THE INVENTION

The present invention relates to multi-functional fuzzy logic circuit.

The fuzzy logic handles fuzziness. Human thought and behavior involve indefiniteness or vagueness. If such vagueness can be expressed in terms of number or amount or theorized, the result will find application to the design of community systems such as traffic control systems, emergency or applied therapeutic systems and the like and to the design of robots simulating the human being. Ever since the concept of fuzzy sets was proposed by L. A. Zadeh in 1965, research has been conducted on the fuzzy logic as a means for handling "vagueness" from the above viewpoint. However, many research efforts are presently directed to the application of the logic to software systems for use with digital computers. The digital computer is adapted to perform operation based on the binary logic with use of 0 and 1. Although the operation is processed very strictly, there is a need to use an A/D convertor circuit for feeding analog amounts. Accordingly the computer has the problem of requiring a long period of time to obtain the final result by processing a vast quantity of information. The programs for handling the fuzzy logic are bound to become complex and require a large-sized digital computer for complicated processing, and hence are uneconomical.

Since the fuzzy logic handles continuous values (0, 1) in the section of from 0 to 1, the logic is inherently incompatible with digital computers which operate on binary logic. Further because the fuzzy logic handles vague amounts having a range, the strictness required thereof is not as high as is required of digital computers. Accordingly, it is desired to provide circuits or systems which are suitable to handle fuzzy logic.

SUMMARY OF THE INVENTION

The main object of the present invention is to provide multi-functional fuzzy logic circuits useful as bases for systems for handling fuzzy logic.

The present invention provides a multi-functional fuzzy logic circuit which comprises at least one input circuit provided for at least one input current for producing at least one output current of the same value in the same direction as the input current and at least one output current of the same value in the reverse direction, and a plurality of fuzzy logic circuits for executing different fuzzy logic operations, each of the fuzzy logic circuits having as its input at least one of the output currents produced by the input circuit.

The term "same value" covers such approximate value to that of the input current that there is no problem for practical purposes. When the input circuit is composed of an FET, the output current of almost same value as the input current can be obtained. Even if a bipolar transistor is used in the arrangement of the input circuit, no problem will arise in practical use when the current amplification factor $\beta$ is very great.

The input circuit can be composed of a one-output or multi-output current mirror. It is desirable that input circuits are provided for two kinds of input currents representing different operation variables of fuzzy logic with respect to each other.

The basic operations according to the fuzzy logic include bounded difference, complement, bounded sum, bounded product, logic union, logic intersection, absolute difference, implication and equivalence. We have found that when a bounded-difference circuit is constructed of a current mirror, wired OR and diode and adapted to operate in current mode, circuits for performing all operations other than bounded difference can be realized with use of one or a plurality of such bounded-difference circuits and wired OR's. Accordingly, the above mentioned fuzzy logic circuits for executing different fuzzy logic operations can be composed of bounded-difference circuits and wired OR's. As will become apparent later, since a current mirror can be substituted for a diode, a desired fuzzy logic circuit can be available by providing one-output or multi-output current mirrors and wired OR's only on a base plate. This becomes one advantage in constructing the multi-functional fuzzy logic circuit into an IC.

When one-output and multi-output current mirrors are composed of a MOS FET, the mirror constant can be maintained at 1, assuring an accurate fuzzy logic operation at the increased speed.

According to the present invention the input circuit for producing output currents in different directions is provided, so that a plurality of different fuzzy logic circuits are given input currents having any direction required by those fuzzy circuits to obtain outputs representing desired results of fuzzy logic operations.

The present invention further provides a multifunctional fuzzy logic circuit which comprises first and second input circuits provided for first and second input currents representing different operation variables of fuzzy logic, a multi-output bounded-difference circuit and a plurality of fuzzy logic circuits executing different fuzzy logic operations. Each of the input circuits produces at least one output current of the same value in the same direction as the input current and at least one output current of the same value in the reverse direction and comprises a one-output current mirror, a multi-output current mirror or a combination thereof. The multi-output bounded-difference circuit comprises the one-output current mirror or multi-output current mirror of one of the input circuits, a wired OR for calculating the difference between the output current from the one-output current mirror or multi-output current mirror of one of the input circuits and the output current from the other input circuit, and a multi-output current mirror to which the output current from the wired OR is fed. At least one of the output currents from the first and second input circuits and the multi-output bounded-difference circuit is fed to each of the fuzzy logic circuits.

Preferably, the multi-functional fuzzy logic circuit further comprises another multi-output bounded-difference circuit comprising the one-output current mirror or multi-output current mirror of the other input circuit, a wired OR for calculating the difference between output current from the one-output current mirror or multi-output current mirror of the other input circuit and the output current from the one input circuit, and a multi-output current mirror having as its input the output current from the wired OR.

According to the present invention, two input circuits are provided for two kinds of input currents representing different operation variables of fuzzy logic operations, so that the fuzzy logic circuits are supplied with these two kind of input currents having both directions.

Further the multi-functional fuzzy logic circuit according to the present invention comprises a third input circuit provided for an input current representing 1 according to fuzzy logic for producing at least one output current having a value of 1 and desired direction, and the plurality of different fuzzy logic circuits each of the fuzzy logic circuits having as its input at least one of output current from the first, second and third input circuits and the multi-output bounded-difference circuit.

The multi-functional fuzzy logic circuit can include a fuzzy logic circuit using a current with a value of 1 according to the fuzzy logic, since above third input circuit is provided.

These and other features of the present invention will become apparent from the following description of embodiments.

BRIEF DESCRIPTION OF THE DRAWINGS

FIGS. 1A, 1B, 1C, and 1D show current input-output modes;

FIGS. 5A, 5B and 5C show the construction of an integrated bounded-difference circuit, (A) being a pattern plan view, (B) being a view in section taken along the line b—b in (A), and (C) being a view in section taken along the line c—c in (A);

FIG. 6 is a diagram showing a bounded-difference circuit comprising a N-MOS FET;

DESCRIPTION OF THE PREFERRED EMBODIMENTS (1) Current input-output modes in fuzzy logic circuits According to the present invention, the fuzzy logic circuit operates in a current mode. Various current input-output modes will be described briefly. In FIG. 1, the input current of a fuzzy logic circuit 10 is indicated at Ii, and the output current thereof at Io. (A) shows an input-output mode in which the input current Ii flows into the circuit 10 and the output current Io flows out from the circuit 10. Such currents will be referred to as "flow-in input" and "flow-out output." In (B), the input current Ii flows out from the circuit 10, and the output current Io flows into the circuit 10, hence flow-out input and flow-in output. Similarly (C) shows flow-in input and flow-in output, and (D) shows flow-out input and flow-out output. When connecting fuzzy logic circuits in cascade, the mode of FIG. 1 (A) or (B) is preferable to use. While FIG. 1 shows examples of single fan-in and single fan-out, like input-output modes are used for multiple fan-in/fan-out circuits.

(2) Basic operations of fuzzy logic

A fuzzy set X is characterized by a membership function $\mu x$. The membership function represents the degree to which a variable thereof belongs to the fuzzy set X. This degree is expressed by a continuous value (0, 1) in the section of from 0 to 1. Accordingly, the membership function can be said to convert the variable to (0, 1). Similarly, a fuzzy set Y is characterized by a membership function $\mu y$.

According to the fuzzy logic, vagueness is expressed by a fuzzy set, which is used for handling the vagueness of a common logic. The basic fuzzy logic includes bounded difference, complement, bounded sum, bounded product, logic union, logic intersection, absolute difference, implication and equivalence. As will become apparent later, these nine basic operations can be expressed by bounded difference and arithmetic sum. This means that the smallest units of the basic operations of fuzzy logic are bounded difference and arithmetic sum. One of the advantages of circuits which operate in current mode is that the arithmetic summation (arithmetic subtraction also) can be realized by a wired OR.

Circuits for performing the foregoing nine basic operations will be described first, and embodiments of the invention will be described thereafter. As a rule, circuits for carrying out the basic operations are provided by P-channel metal-oxide-semiconductor field-effect transistors (P-MOS FET), and the current mode of flow-out input/flow-in output is used. However, fuzzy logic circuits can be realized also by N-channel MOS FET and complementary MOS FET (N-MOST FET and C-MOS FET).

(3) Bounded-difference circuit

For fuzzy sets X, Y, the bounded difference is defined as follows with use of their membership functions $\mu x$, $\mu y$.

$$
\begin{aligned}
X \ominus Y &\rightleftarrows \mu_{x \ominus y} \\
&= \mu x \ominus \mu y \\
&= 0 V(\mu x - \mu y)
\end{aligned} \quad (1)
$$

wherein $\ominus$ is bounded difference, V is logic union (max) (the greatest should be selected), and − represents arithmetic subtraction. The fuzzy logic does not use negative values, so that when $(\mu x - \mu y)$ in Expression (1) is a negative value, the bounded difference becomes 0 owing to the logic union V. Specifically, Expression (1) represents the following relation.

$$
\mu_{x \ominus y} = \begin{cases} \mu x - \mu y & (\mu x > \mu y) \\ 0 & (\mu x \leq \mu y) \end{cases} \quad (2)
$$

Figure 2:
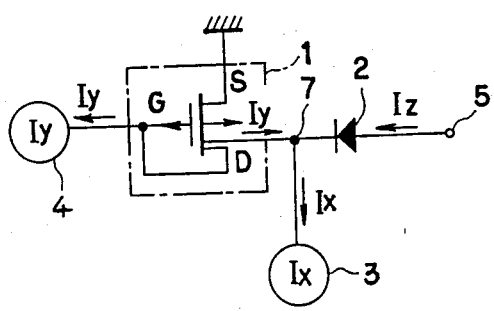
FIG. 2 is a diagram showing a bounded-difference circuit.
Figure 4A:
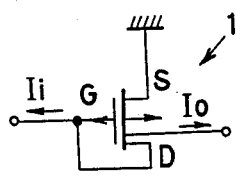
FIGS. 4A, 4B show a circuit diagram of two equivalent current mirrors.
Figure 4B:
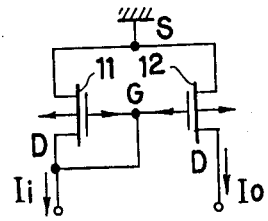

FIG. 2 shows a bounded-difference circuit, which comprises a current mirror 1 comprising a P-MOS FET, a wired OR 7, a diode 2, two current sources 3, 4 and an output terminal 5. The current mirror 1, which is shown also in FIG. 4, (A), is equivalent to a current mirror shown in FIG. 4(B) and comprising two P-MOS FET 11, 12.

With reference to FIG. 4 (B), the source S of the two FET's 11, 12 is grounded. The gates G thereof are connected together and further connected to the drain D of one FET 11. When a flow-out input Ii is given to the drain D of the FET 11, a flow-out current Io (=Ii) is obtained from the drain D of the other FET 12. This is because a gate voltage (between the gate and the source S) is applied so that the drain current becomes equal to Ii in the FET 11 and because this gate voltage also acts on the other FET 12 to make the drain current of the FET 12 also equal to Ii, provided that the two FET's 11, 12 are equivalent in structure and Si-SiO₂ interface properties. No current flows through the short circuit between the gate G and the drain D of the FET 11.

If the two FETIs are identical in structure and Si-SiO₂ interface properties, an output current Io equal to the input current Ii is obtained irrespective of the intensity of the input current. This is a distinct feature of current mirrors comprising FET's. With current mirrors comprising bipolar elements such as common p-n junction transistors, the relation of Ii=Io is available only when the current amplification factor $\beta$ is very great. If the input current Ii is small, the factor $\beta$ is also small, so that the above relation is not obtained. The current mirror of FIG. 4(B) will hereinafter be referred to by the symbol used in FIG. 4(A).

Referring to FIG. 2 again, when the current source 4 for giving a flow-out input current Iy is connected to the input drain (gate) of the current mirror 1, a flow-out current of equal value Iy is obtained at the output drain, as will be apparent from the above description. Connected by way of the wired OR 7 to the output drain are the current source 3 for giving a flow-out input current Ix and the output terminal 5, the latter being so connected via a diode 2 which is backward with respect to the direction of outflow of the mirror. Since the current of value Ix is drawn by the current source 3, an output current of Iz=Ix−Iy flows from the terminal 5 through the diode 2 into the source 3 only when Ix is greater than Iy. If Ix is not greater than Iy, an output current of Iy−Ix is to flow out, but this current is blocked by the diode 2, with the result that the output current toward the terminal 5 is zero.

The above relation will be expressed as follows.

$$
Iz = \begin{cases} Ix - Iy & (Ix > Iy) \\ 0 & (Ix \leq Iy) \end{cases} \quad (3)
$$

When the membership functions $\mu x$, $\mu y$ are made to correspond to the input currents Ix, Iy, respectively, and the bounded difference $\mu_{x \ominus y}$ to the output current Iz, Expression (3) represents exactly the same relation as Expression (2). It will be understood that the circuit of FIG. 2 is the basic operation circuit for bounded difference.

Figure 3:
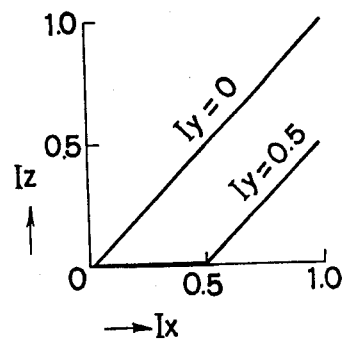
FIG. 3 is a graph showing the input-output characteristics of the same.

FIG. 3 shows the relation between the input current Ix and the output current Iz when the other input current Iy is used as a parameter. In this case, both input and output currents are so normalized that the maximum will be 1.

FIG. 5 shows an example of integrated circuit (IC) structure into which the bounded-difference circuit of FIG. 2 is built. The substrate (second gate) is not shown. The circuit can be formed on an n-type base plate 30 by the common process for fabricating P-MOS.

An Al (conductor) pattern 61 serving as the source of the current mirror 1 is in ohmic contact with a p-region 41. An Al pattern 62 serving as the input drain is connected to a p-region 42. An Al pattern 63 providing the output drain is also connected to a p-region 43. The two FET's are made identical in channel width, channel length and thickness of the gate oxide layer. A polycrystal Si (B doped, p-type) 50 serving as the gate is enclosed by an insulating layer 51 and is positioned between the p-region 41 and p-regions 42, 43. The polycrystal Si 50, which is connected to the Al pattern 62, is insulated from the Al pattern 63 by the layer 51 which is made of SiO₂. A p-region 44 and an n-region 45 provide the diode 2. The Al pattern 63 extends over and is connected to the n-region which serves as a cathode. An Al pattern 64 connected to the p-region 44.

FIG. 6 shows a bounded-difference circuit provided by an N-MOS FET. The current input-output mode is flow-in input/flow-out output. The FET is also provided with two drains, one connected to the gate and the other to the output side. The source is grounded. The diode 2 is oriented of course in a reverse direction to the one shown in FIG. 2. The operation of Expression (3) can be performed also by this circuit.

In FIG. 6, the current sources are replaced by input terminals 3, 4. For the sake of simplification, this manner will be used in the following description of various circuits.

(4) Complement circuit

For the fuzzy set Y, the complement is defined as follows using the membership function $\mu y$ thereof and can be expressed with use of bounded difference.

$$
\begin{aligned}
\overline{Y} &\rightleftarrows \mu \overline{y} \\
&= 1 - \mu y \\
&= 1 \ominus \mu y
\end{aligned} \quad (4)
$$

A comparison of Expression (4) with Expression (1) or (2) indicates that the complement is bounded difference wherein $\mu x = 1$.

Figure 7:
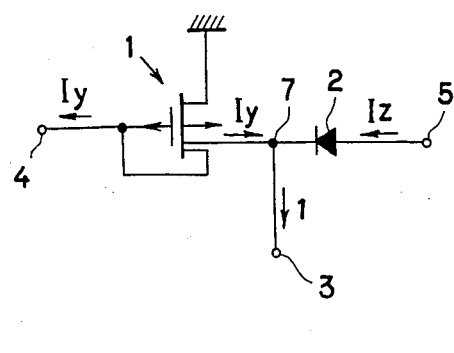
FIG. 7 is a diagram showing a complement circuit.
Figure 8:
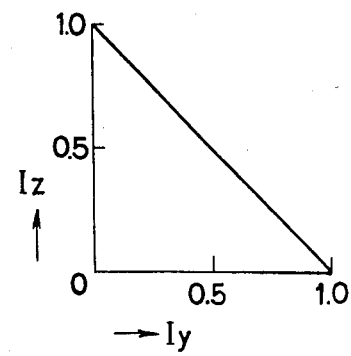
FIG. 8 is a graph showing the input-output characteristics of the same.

Accordingly the complement circuit shown in FIG. 7 corresponds to the circuit of FIG. 2 wherein $Ix = 1$. Accordingly the input current source 3 used is one which produces an input current of value 1 (max). In this case, the current (equal to Iy) flowing out from the output drain can not be greater than the input current 1 of the terminal 3, so that the diode 2 can be omitted. FIG. 8 shows the relation between the input current Iy and the output current Iz involved in the operation of complement.

(5) Bounded-sum circuit

For the fuzzy sets X, Y, the bounded sum is defined as follows with use of their membership functions $\mu x$, $\mu y$.

$$X \oplus Y \rightleftarrows \mu_{x \oplus y} \quad (5)$$
$$= \mu x \oplus \mu y$$
$$= 1 \wedge (\mu x + \mu y)$$

wherein $\oplus$ is bounded sum, $\wedge$ is logic intersection (min) (the smallest is to be selected), and + represents arithmetic summation. Since values exceeding 1 are not used in the fuzzy logic, the bounded sum becomes 1 owing to the logic intersection $\wedge$ if $(\mu x + \mu y)$ is above 1. More specifically, Expression (5) represents the following relation.

$$\mu_{x \oplus y} = \begin{cases} \mu x + \mu y & (\mu x + \mu y < 1) \\ 1 & (\mu x + \mu y \geq 1) \end{cases} \quad (6)$$

The bounded sum of Expression (5) can be expressed as follows.

$$1 \wedge (\mu x + \mu y) = 1\Theta(1\Theta(\mu x + \mu y)) \quad (7)$$

Expression (7) can be established in the following manner.

$$1\Theta(1\Theta(\mu x + \mu y)) \equiv 1\Theta(1\Theta(x + y)) \quad (8)$$
$$= OV(1 - (1\Theta(x + y)))$$
$$= OV(1 - (OV(1 - x - y)))$$
$$= OV((1 - O) \wedge (1 - (1 - x - y)))$$
$$= 1 \wedge (x + y))$$
$$\equiv 1 \wedge (\mu x + \mu y)$$

Expression (7) indicates that the bounded sum can be calculated by a single arithmetic summation operation and repeating bounded difference operation two times. This further indicates that the bounded-sum circuit can be realized by a single wired OR and two bounded-difference circuits.

Figure 9:
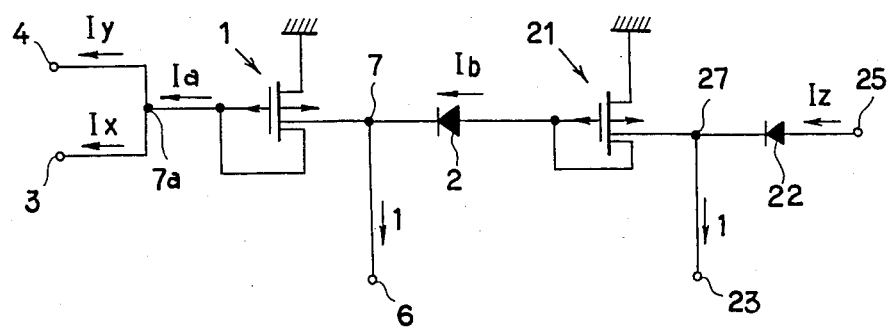
FIG. 9 is a diagram showing a bounded-sum circuit.

FIG. 9 shows a bounded-sum circuit. The arithmetic sum $Ia = Ix + Iy$ of the flow-out input currents Ix and Iy of input terminals 3, 4 is calculated by a wired OR 7a, and the current Ia becomes an input for the first bounded-difference circuit. Another input terminal 6 of this circuit is given a flow-out input current having the value of 1. Accordingly, the flow-in output current Ib of the first bounded-difference circuit is given by the following expression.

$$Ib = \begin{cases} 1 - Ia = 1 - (Ix + Iy) & (1 > Ix + Iy) \\ 0 & (1 \leq Ix + Iy) \end{cases} \quad (9)$$

The output current Ib serves as an input for the second bounded-difference circuit. This circuit in the second stage comprises a current mirror 21, a diode 22 and a wired OR 27 and has another input terminal 23, to which an input current having the value 1 is given. The output terminal 25 of the second-stage circuit has a flow-in output current Iz which is given by:

$$Iz = \begin{cases} 1 - Ib = Ix + Iy & (1 > Ix + Iy) \\ 1 & (I \leq Ix + Iy) \end{cases} \quad (10)$$

Expression (10) corresponds to Expression (6). It will be understood that the operation for the bounded sum can be executed by the circuit of FIG. 9. The circuit of FIG. 9 can be easily made into an IC by providing the IC pattern of FIG. 5 in two stages.

The currents flowing out from the output drains of the current mirrors 1 and 21 (which currents are equal to Ia and Ib, respectively) can not be greater than the input current 1 of the terminals 6, 23, so that the diodes 2, 22 can be dispensed with. This is advantageous to the present circuit when it is made into an IC.

(6) Bounded-product circuit

For the fuzzy sets X, Y, the bounded product is defined as follows using their membership functions $\mu x$, $\mu y$ and can be expressed with use of the bounded difference.

$$X \odot Y \rightleftarrows \mu_{x \odot y} \quad (11)$$
$$= OV(\mu x + \mu y - 1)$$
$$= (\mu x + \mu y) \Theta 1$$

wherein $\odot$ represents the bounded product. According to the definition of bounded product by Expression (11), the product is obtained by subtracting 1 from the arithmetic sum of the membership fuctions $\mu x$ and $\mu y$ and selecting the greater of the subtraction result and 0. More specifically, this indicates the following relation.

$$\mu_{x \ y} = \begin{cases} \mu x + \mu y - 1 & (\mu x + \mu y - 1 > 0) \\ 0 & (\mu x + \mu y - 1 \leq 0) \end{cases} \quad (12)$$

Figure 10:
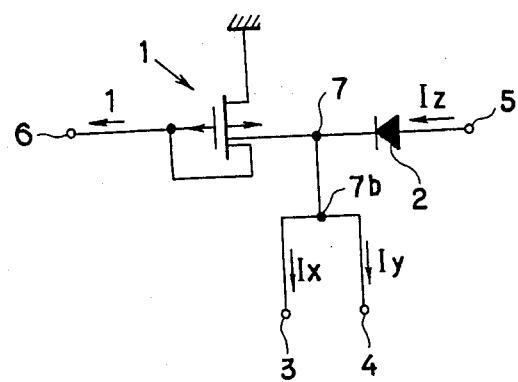
FIG. 10 is a diagram showing a bounded-product circuit.

On the other hand, Expression (11) shows that the operation for the bounded product is performed with use of arithmetic sum and bounded difference. FIG. 10 shows a bounded-product circuit, in which a flow-out input current having a value of 1 is fed to the gate input terminal 6 of a current mirror 1. A wired OR circuit 7b calculates the sum of two input currents Ix and Iy, and the sum current is used as an input for the output drain of the mirror 1. The output current Iz of this circuit is therefore given by:

$$Iz = \begin{cases} Ix + Iy - 1 & (Ix + Iy > 1) \\ 0 & (Ix + Iy \leq 1) \end{cases} \quad (13)$$

With Expression (13) corresponding to Expression (12), it is apparent that the circuit FIG. 10 gives the bounded product. The bounded-product circuit of FIG. 10 can be easily made into an IC by providing an Al pattern 65 as connected to the Al pattern 63 in FIG. 5(A).

(7) Logic union circuit (MAX circuit)

For the fuzzy sets X, Y, the logic union is defined as follows using their membership functions $\mu x$, $\mu y$.

$$X \cup Y \rightleftarrows \mu_{x \cup y} = \mu x \vee \mu y \quad (14)$$

The logic union means that the larger one of $\mu x$ and $\mu y$ is to be selected, so that Expression (14) can be rewritten as follows:

$$\mu_{x \cup y} = \begin{cases} \mu x & (\mu x > \mu y) \\ \mu y & (\mu x \leq \mu y) \end{cases} \quad (15)$$

Expression (14) can be modified as follows:

$$\mu x \vee \mu y = (\mu x \ominus \mu y) + \mu y \quad (16)$$
$$= (\mu y \ominus \mu x) + \mu x$$

Expression (16) can be established as follows:

$$(\mu x \ominus \mu y) + \mu y = (x \ominus y) + y \quad (17)$$
$$= [OV(x - y)] + y$$
$$= (y + O)V(y + (x - y))$$
$$= y \vee x$$
$$= \mu y \vee \mu x$$

Figure 11:
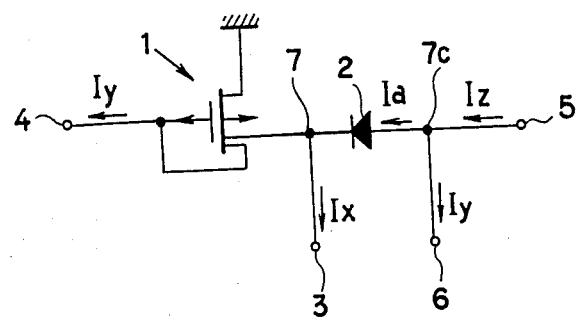
FIG. 11 is a diagram showing a logic union circuit.

Expression (16) shows that the logic union can be calculated by the bounded-difference circuit and wired OR. FIG. 11 shows a logic union circuit, in which the output current Ia of the bounded-difference circuit is given by:

$$Ia = \begin{cases} Ix - Iy & (Ix > Iy) \\ 0 & (Ix \leq Iy) \end{cases} \quad (18)$$

A curent Iy is fed to a terminal 6, and current Ia and current Iy are added by a wired OR 7c. The final output current Iz, which is given by $Iz = Ia + Iy$, is as follows:

$$Iz = \begin{cases} Ix & (Ix > Iy) \\ Iy & (Ix \leq Iy) \end{cases} \quad (19)$$

By comparing Expression (19) with Expression (15), it is seen that the operation of logic union is performed. The logic union circuit can be obtained in the form of an IC circuit by additionally using an Al pattern 66 as connected to the Al pattern 64 of FIG. 5(A).

As seen in FIG. 11, two current sources are needed for the input current (Iy in FIG. 11). Further in FIG. 11, the same result is obtained even when the input currents Ix and Iy are exchanged.

(8) Logic intersection circuit(MIN circuit)

For the fuzzy sets X, Y, the logic intersection is defined as follows using their membership functions $\mu x$, $\mu y$.

$$X \cap Y \rightleftarrows \mu_{x \cap y} = \mu x \wedge \mu y \quad (20)$$

Since the logic intersection $\wedge$ means that the smaller of $\mu x$ and $\mu y$ is to be selected, Expression (20) can be rewritten as follows:

$$\mu_{x \cap y} = \begin{cases} \mu y & (\mu x > \mu y) \\ \mu x & (\mu x \leq \mu y) \end{cases} \quad (21)$$

Expression (20) can be modified as follows:

$$\mu_{x \cap y} = \mu x \ominus (\mu x \ominus \mu y) \quad (22)$$
$$= \mu y \ominus (\mu y \ominus \mu x)$$

Expression (22) can be established as follows:

$$\mu x \ominus (\mu x \ominus \mu y) = x \ominus (x \ominus y) \quad (23)$$
$$= OV[x - (x \ominus y)]$$
$$= OV[x - [OV(x - y)]]$$
$$= OV[(x - O) \wedge (x - (x - Y))]$$
$$= OV(x \quad y)$$
$$= x \wedge y$$
$$= \mu x \wedge \mu y$$

Figure 12:
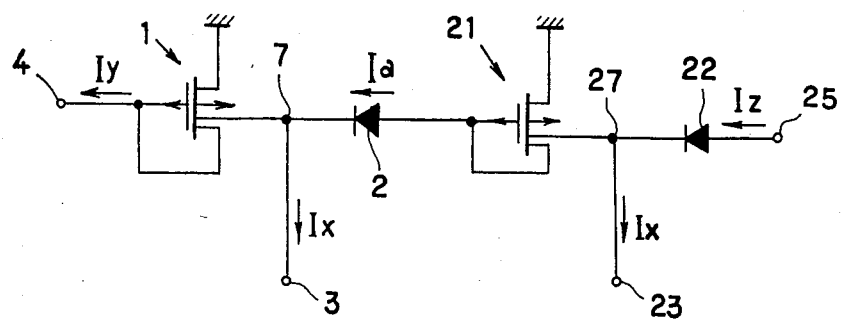
FIG. 12 is a diagram showing a logic intersection circuit.

Expression (20) indicates that the operation for logic intersection can be realized by two bounded-difference circuits. FIG. 12 shows a logic intersection circuit, in which the output current Ia of the bounded-difference circuit in the first stage is given by the following Expression.

$$Ia = \begin{cases} Ix - Iy & (Ix > Iy) \\ 0 & (Ix \leq Iy) \end{cases} \quad (24)$$

The current Ia becomes one input current for the bounded difference circuit in the second stage, and Ix is given as the other input current (terminal 23). Accordingly the output current Iz of the second bounded difference circuit is given by the following expression.

$$Iz = \begin{cases} Iy & (Ix > Iy) \\ Ix & (Ix \leq Iy) \end{cases} \quad (25)$$

By making Expression (25) correspond to Expression (21), it is seen that the operation for logic intersection is performed.

Since no current is likely to flow into the gate of the current mirror 21 of the latter-stage bounded-difference circuit, the diode 2 can be omitted.

Figure 13:
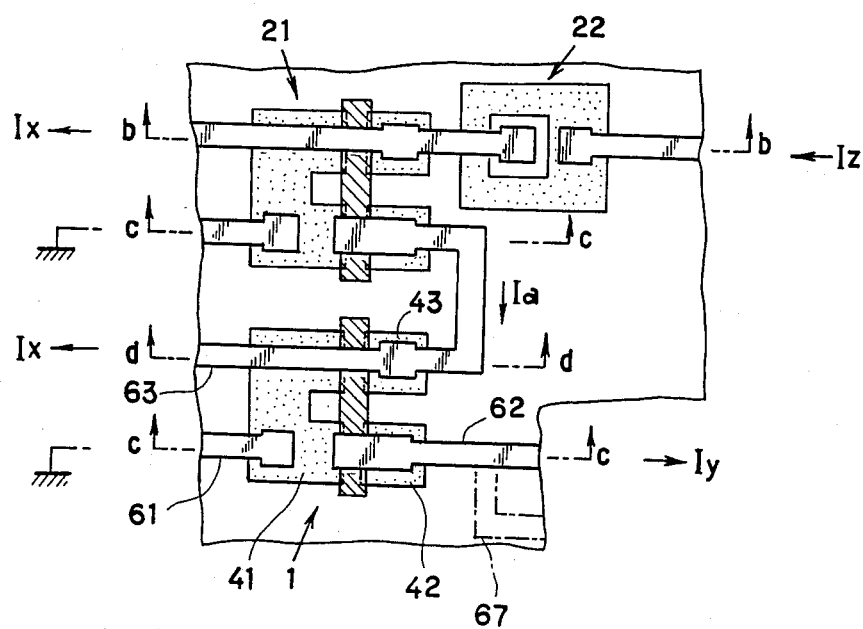
FIG. 13 is an IC pattern plan view of the same.

FIG. 13 shows the logic intersection circuit of FIG. 12 as fabricated into an IC. Since the diode 2 can be omitted from FIG. 12, the diode is omitted from the construction of FIG. 13. Further the IC pattern of the current mirror 1 in the circuit of the first stage is referred to by corresonding reference numerals used in FIG. 5(A). The views in section along the line b—b and line c—c are the same as FIGS. 5(B) and (C) as to the structure shown. The section taken along the line d—d is the same as part of the section shown in FIG. 5(B) (FIG. 17(B)). The current mirror in the first stage is connected to the current mirror in the second stage by Al pattern 63. With reference to FIG. 5, it is seen that the IC pattern of FIG. 13 constitutes the circuit of FIG. 12.

The IC pattern of the bounded-sum circuit (FIG. 9) is obtained by connecting an Al pattern 67 to the Al pattern 62 in FIG. 13.

(9) Absolute-difference circuit

For the fuzzy sets X, Y, the absolute difference is defined as follows with use of their membership functions $\mu x$ and $\mu y$.

$$|X - Y| \rightleftarrows \mu_{|x-y|} \qquad (26)$$
$$\equiv |\mu x - \mu y|$$
$$= \begin{cases} \mu x - \mu y & (\mu x > \mu y) \\ \mu y - \mu x & (\mu x \leq \mu y) \end{cases}$$

Expression (26) can be modified as follows:

$$\mu_{|x-y|} = (\mu x \ominus \mu y) + (\mu y \ominus \mu x) \qquad (27)$$

Expression (27) can be established in the following manner.

$$(\mu x \ominus \mu y) + (\mu y \ominus \mu x) \equiv (x \ominus y) + (y \ominus x) \qquad (28)$$
$$= (x \ominus y) + [0 \vee (y - x)]$$
$$= [(x \ominus y) + 0] \vee [(x \ominus y) + (y - x)]$$
$$= [[0 \vee (x - y)] + 0] \vee$$
$$[[0 \vee (x - y)] + (y - x)]$$
$$= [(0 + 0) \vee (0 + x - y)] \vee$$
$$[(y - x + 0) \vee (x - y + y - x)]$$
$$= 0 \vee (x - y) \vee (y - x) \vee 0$$
$$= (x - y) \vee (y - x)$$
$$\equiv (\mu x - \mu y) \vee (\mu y - \mu x)$$

Figure 14:
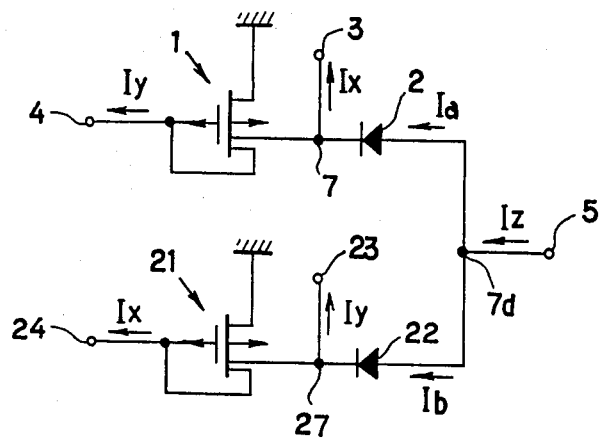
FIG. 14 is a diagram showing an absolute-difference circuit.

Expression (27) indicates that the operation of the absolute difference can be realized by two bounded-difference circuits and one wired OR. FIG. 14 shows an absolute-difference circuit. With reference to this drawing, the output current $I_a$ of one bounded-difference circuit including a current mirror 1 and a diode 2 is given by:

$$I_a = \begin{cases} Ix - Iy & (Ix > Iy) \\ 0 & (Ix \leq Iy) \end{cases} \qquad (29)$$

In the other bounded-difference circuit including a current mirror 21 and a diode 22, the input currents Ix and Iy thereof are exchanged with those of the above-mentioned one circuit, so that the output current thereof, Ib, is given by:

$$Ib = \begin{cases} 0 & (Ix > Iy) \\ Iy - Ix & (Ix \leq Iy) \end{cases} \qquad (30)$$

The output current Iz of the absolute-difference circuit, which is arithmetic sum of the output currents Ia and Ib, is as follows:

$$Iz = Ia + Ib \qquad (31)$$
$$= \begin{cases} Ix - Iy & (Ix > Iy) \\ Iy - Ix & (Ix \leq Iy) \end{cases}$$

By making Expression (31) correspond to Expression (26), it will be understood that the operation of absolute difference is performed.

Figure 15:
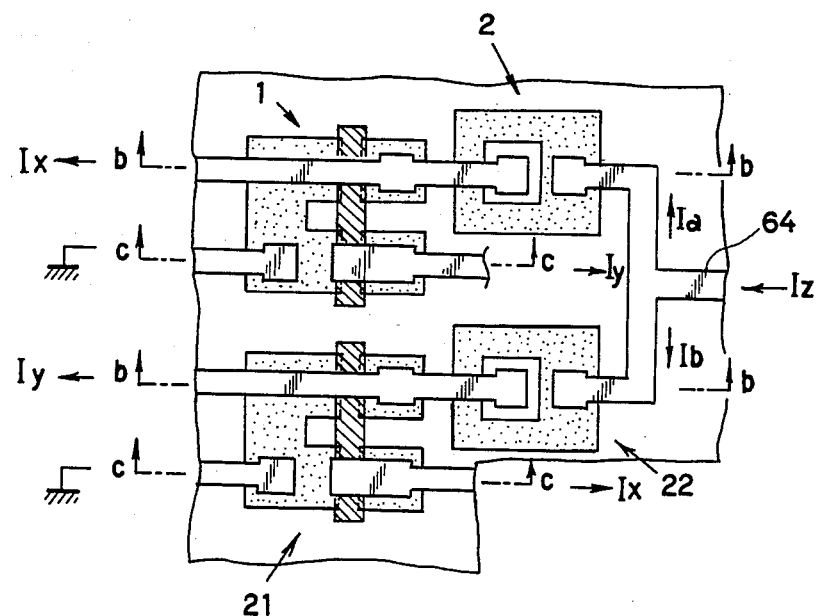
FIG. 15 is an IC pattern plan view of the same.

FIG. 15 shows the absolute-difference circuit of FIG. 14 as fabricated into an IC. Since two diodes 2 and 22 can not be omitted, the IC of FIG. 15 comprises two bounded-difference IC's such as the one shown in FIG. 5, and Al patterns 64 connected to the anodes of the diodes 2, 22 and connected to each other to give an output. The b—b section and c—c section are the same as those shown in FIGS. 5(B) and (C).

(10) Implication circuit

For the fuzzy sets X, Y, the implication is defined as follows by their membership functions $\mu x$, $\mu y$.

$$X \rightarrow Y \rightleftarrows \mu_{x \rightarrow y} \equiv 1 \wedge (1 - \mu x + \mu y) \qquad (32)$$

Since $\mu x$ represents the degree of belonging to the set X, $(1 - \mu x)$ represents the degree of not belonging to the set X. Further for the logic intersection , the smaller is to be selected. In view of the above, implication represents the arithmetic sum of the above two kinds of degrees, and means that when the sum is greater than 1, 1 is taken as the result. For a better understanding, Expression (32) will be modified as follows:

$$1 \wedge (1 - \mu x + \mu y) \qquad (33)$$
$$= \begin{cases} 1 - \mu x + \mu y & (\mu x > \mu y) \\ 1 & (\mu x \leq \mu y) \end{cases}$$

Further Expression (32) can also be modified as follows:

$$1 \wedge (1 - \mu x + \mu y) = 1 \ominus (\mu x \ominus \mu y) \qquad (34)$$

Expression (34) can be established as follows:

$$1 \ominus (\mu x \ominus \mu y) \equiv 1 \ominus (x \ominus y) \qquad (35)$$
$$= 0 \vee [1 - (x \ominus y)]$$
$$= 0 \vee [1 - [0 \vee (x - y)]]$$
$$= 0 \vee [(1 - 0) \wedge (1 - (x - y))]$$
$$= 0 \vee [1 \wedge (1 - x + y)]$$
$$= 1 \wedge (1 - x + y)$$
$$\equiv 1 \wedge (1 - \mu x + \mu y)$$

Figure 16:
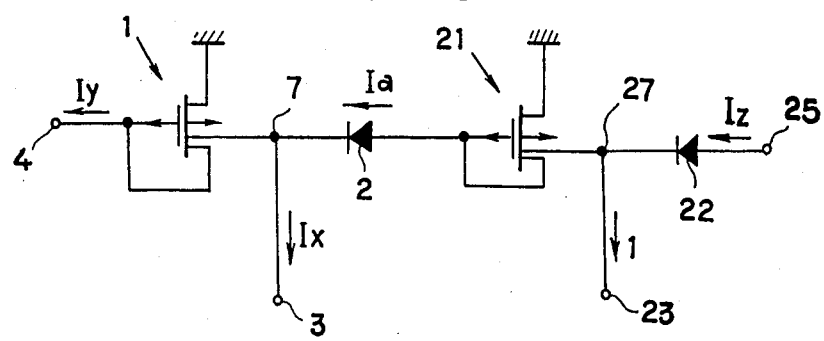
FIG. 16 is a diagram showing an implication diagram.

Expression (34) shows that the operation for the implication can be realized by two bounded-difference circuits. FIG. 16 shows an implication circuit. With reference to the diagram, the output current Ia of the bounded-difference circuit in the first stage is given by:

$$Ia = \begin{cases} Ix - Iy & (Ix > Iy) \\ 0 & (Ix \leq Iy) \end{cases} \quad (36)$$

This current Ia serves as one input current for the bounded-difference circuit in the second stage, while a current having a value of 1 is given as the other input current (terminal 23). Accordingly the output current Iz of the second circuit is given by:

$$Iz = \begin{cases} 1 - Ix + Iy & (Ix > Iy) \\ 1 & (Ix \leq Iy) \end{cases} \quad (37)$$

By making Expression (37) correspond to Expression (33) it is seen that the operation for the implication is performed.

Figure 17A:
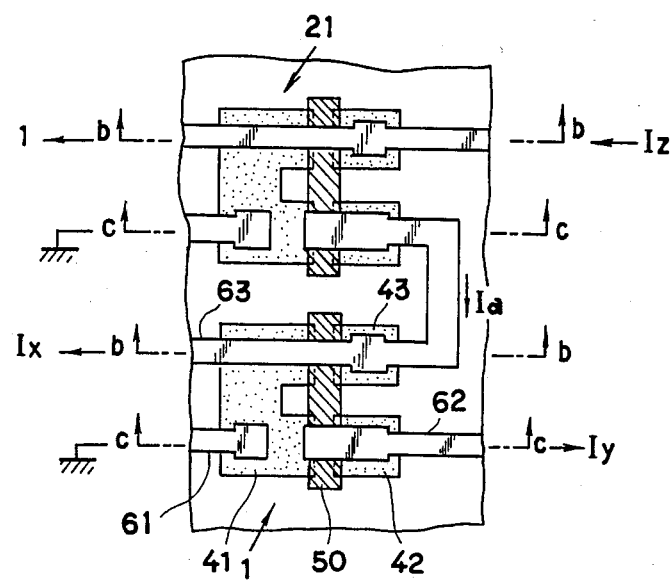
FIGS. 17A and 17B shows an IC pattern of the same, (A) being a plan view, and (B) being a view in section taken along the line b—b in (A)
Figure 17B:
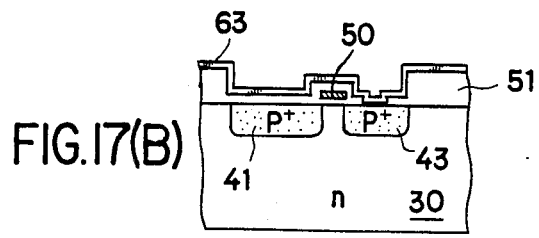

With reference to FIG. 16, the diode 2 can be omitted for the same reason as in the case of the logic intersection circuit (FIG. 12). Because the current (equal to Ia) flowing out from the output drain of the current mirror 21 in the second stage is unlikely to become greater than the input current 1 of the terminal 23, the diode 22 can also be omitted. Accordingly, when the implication circuit of FIG. 16 is to be made into an IC, the diodes 2, 22 need not be provided as shown in FIG. 17 (A). In FIG. 17 (A), the c—c section is the same as the one shown in FIG. 5 (B).

(11) Equivalence circuit

For the fuzzy sets X, Y, the equivalence is defined as follows using their membership functions $\mu x$, $\mu y$.

$$X \rightleftarrows Y \rightleftarrows \mu_{x \rightleftarrows y} \quad (38)$$
$$= \mu_{x \rightarrow y} \wedge \mu_{y \rightarrow x}$$

Since the equivalence is thus expressed by the smaller of the two implications $\mu_{x \rightarrow y}$ and $\mu_{y \rightarrow x}$, the above definition (33) of implication can be utilized to express the equivalence as follows:

$$\mu_{x \rightleftarrows y} = \begin{cases} 1 - \mu x + \mu y & (\mu x > \mu y) \\ 1 - \mu y + \mu x & (\mu x \leq \mu y) \end{cases} \quad (39)$$

Expression (39) can be modified as follows:

$$\mu_{x \rightleftarrows y} = 1 \ominus ((\mu x \ominus \mu y) + (\mu y \ominus \mu x)) \quad (40)$$

Expression (40) can be established as follows:

$$\begin{aligned} X &\rightleftarrows Y \\ &= (X - Y) \wedge (Y - X) \\ &= \overline{(x \ominus y)} \wedge \overline{(y \ominus x)} \\ &= \overline{(x \ominus y) \vee (y \ominus x)} \\ &= \overline{|x - y|} \\ &= 1 - |x - y| \\ &= 1 - ((x \ominus y) + (y \ominus x)) \end{aligned} \quad (41)$$

-continued
$$= 1 \ominus ((x \ominus y) + (y \ominus x))$$

Figure 18:
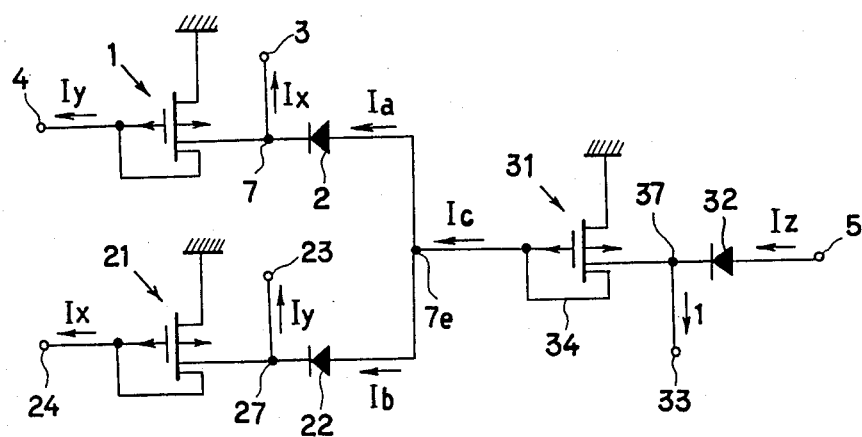
FIG. 18 is a diagram showing an equivalence circuit.

Expression (40) shows that the equivalence operation can be performed by three bounded-difference circuits and one wired OR. FIG. 18 shows an equivalence circuit. A first bounded-difference circuit including a current mirror 1 and a second bounded-difference circuit including a current mirror 21 are connected in parallel (wired OR 7e). The two parallel circuits connected together provide the aforementioned absolute-difference circuit. Accordingly the output current Ic thereof is expressed as follows with reference to Expression (31).

$$Ic = \begin{cases} Ix - Iy & (Ix > Iy) \\ Iy - Ix & (Ix \leq Iy) \end{cases} \quad (42)$$

A third bounded-difference circuit comprises a current mirror 31, a diode 32 and a wired OR 37. One of the input currents is the above output current Ic, and the other input current (input terminal 33) is a current having a value of 1. Accordingly, the output current Iz of the third circuit is given by:

$$Iz = \begin{cases} 1 - (Ix - Iy) & (Ix > Iy) \\ 1 - (Iy - Ix) & (Ix \leq Iy) \end{cases} \quad (43)$$

A comparison of Expression (43) with Expression (39) indicates that the equivalent operation is executed.

With reference to Expression (43), when Ix=Iy, (Ix−Iy)=(Iy−Ix)=0, so that Iz=1. Thus, when the two input currents Ix and Iy are equal, the output current Iz has a value of 1. If otherwise, Iz≠1. Accordingly, when giving attention only to whether the output current Iz is 1 or not, the equivalence circuit can be considered as a matching circuit.

As will be apparent from Expression (42), the current Ic represents the diffference between Ix and Iy. When Ix=Iy, Ic=0. Further when the short circuit 34 is opened in the current mirror 31, the element serves merely as a single FET, which is off only when Ic=0. Since flow-out current of value 1 is given to the input terminal 33, Iz=1 when the FET is off. When FET is on (Ic≠0), the flow-out input current of the input terminal 33 flows through the FET, with the result that Iz=0. It will be understood that the circuit of FIG. 18 becomes a matching circuit with a binary output (current mode) when the short circuit 34 is opened.

Further the current (=Ic) flowing out from the output drain of the current mirror 31 has no likelihood of becoming greater than the input current 1 of the terminal 33, so that the diode 32 can be omitted.

Figure 19:
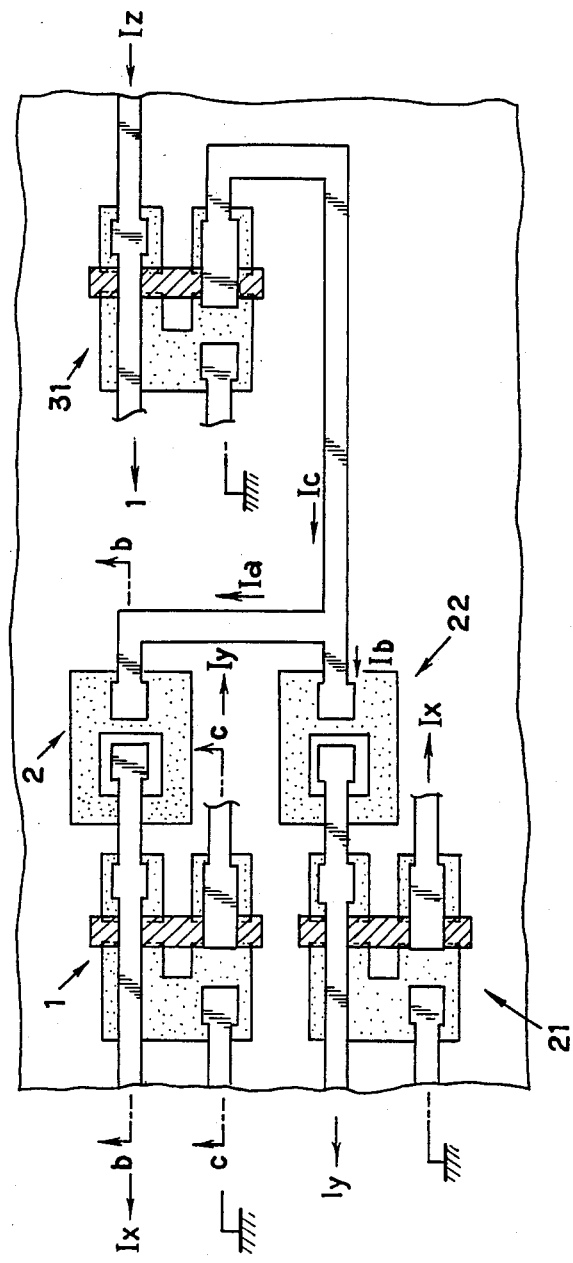
FIG. 19 is an IC pattern plan view of the same.

FIG. 19 shows the circuit of FIG. 18 as fabricated into an IC. In the equivalence circuit, the diode 32 can be omitted, but the diodes 2 and 22 can not be omitted. Accordingly the IC base is provided thereon with two bounded difference circuits comprising a current mirror and a diode, and another current mirror. The sections taken along the line b—b and the line c—c are the same as those shown in FIGS. 5 (B) and (C), respectively.

(12) Current distributor circuit

The bounded-sum circuit (FIG. 9) requires two current sources having a value of 1. Similarly, the logic union circuit (FIG. 11), logic intersection circuit (FIG.

Figure 20:
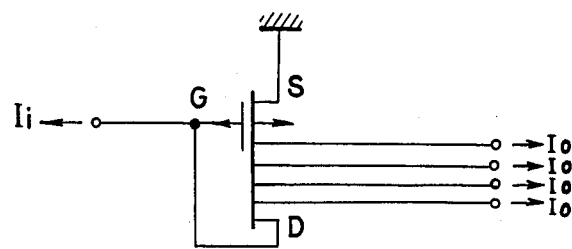
FIG. 20 is a circuit diagram showing a multi-output current mirror.

12), absolute-difference circuit (FIG. 14) and equivalence circuit (FIG. 18) require two current sources for the input current Ix or Iy. Current distributors are useful when currents of the same value in the same direction are necessary. The distributor is readily available based on the concept of the current mirror. In the case of the current mirror of FIG. 4 (A), as also apparent from the IC of FIG. 5, the base plate is provided thereon with two drains, a common source and a common gate, and one of the drains is connected to the common gate. When the base plate has thereon at least three drains one of which is connected to a common gate (multi-output current mirror), currents of a value equal to the gate current (input drain current) are available at the same time from at least two other drains. Such a multi-output current mirror can be represented as seen in FIG. 20. The example shown in FIG. 20 delivers four outputs.

Figure 21:
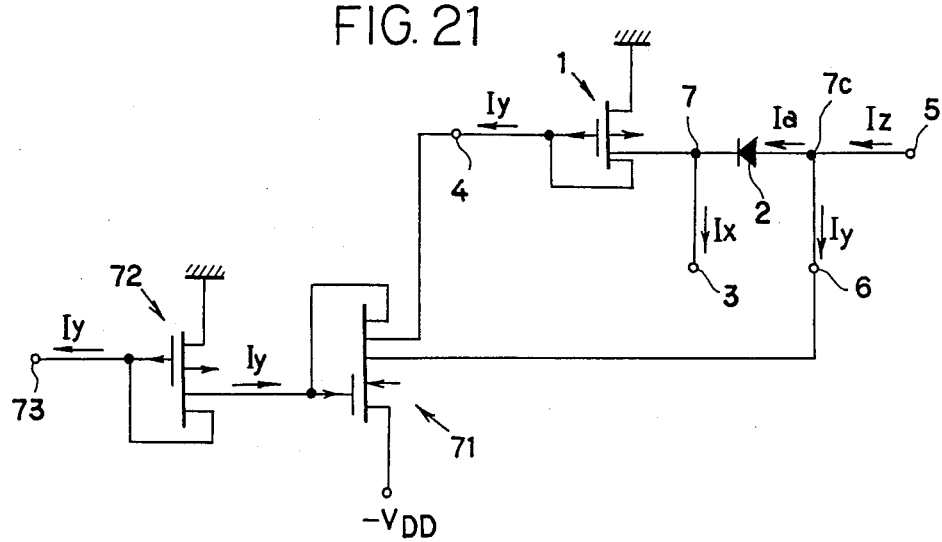
FIG. 21 a diagram showing a logic union circuit incorporating a current distributor.

FIG. 21 shows a current distributor as used for the logic union circuit (FIG. 11). With the logic union circuit, the current Iy (flow-out input) must be fed to two terminals 4 and 6. Accordingly, the flow-out input current Iy of a terminal 73 is converted to a flow-in input current Iy by a current mirror 72. This flow-in input is fed to a multi-output current mirror 71 for giving two flow-out input currents Iy. The mirror 71 comprises an N-MOS FET.

(13) Multiple fan-out circuit

Figure 22:
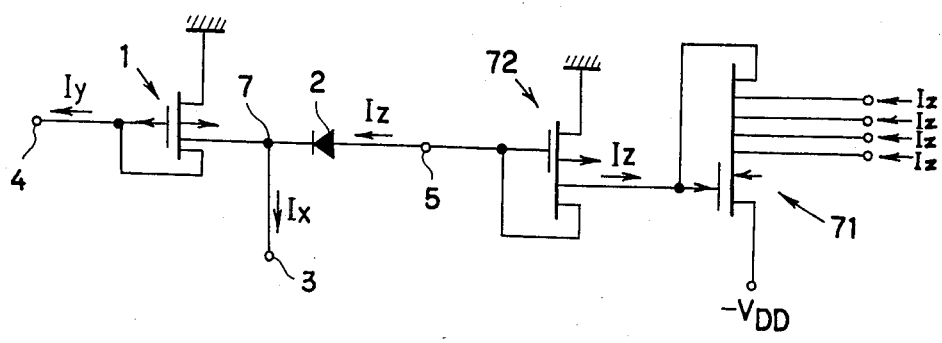
FIG. 22 is a diagram showing a bounded-difference circuit including a current distributor.

The multi-output current mirror is usable for giving a multiplicity of outputs of the same value. FIG. 22 shows an embodiment wherein the above-mentioned current mirror 72 and multi-output current mirror 71 (with a different number of output terminals) are used for the bounded-difference circuit of FIG. 2. It is seen that a single flow-in output current Iz affords four flow-in output currents Iz. The circuit composed of the mirrors 71 and 72 produces a plurality of output currents of the same value in the same direction as the input current and is therefore substantially a current distributor. For the sake of discrimination, a circuit for producing a plurality of currents in the same direction as the input current is called a "current distributor," while a circuit which produces a plurality of output currents in a reverse direction to the input current is termed a "multiple fan-out circuit" (multi-output current mirror).

(14) Multi-output bounded-difference circuit

Figure 23:
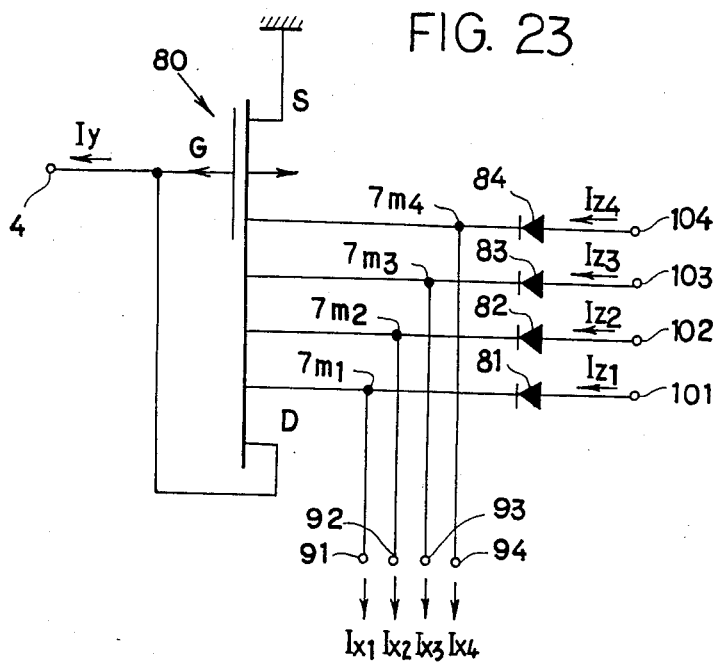
FIG. 23 is a diagram showing a multi-output bounded-difference circuit.
Figure 24A:
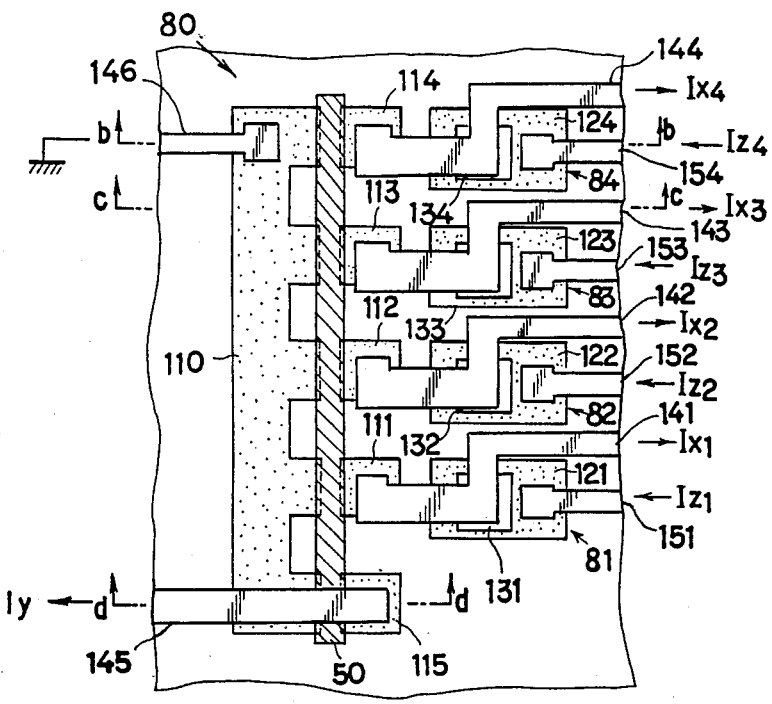
FIGS. 24A, 24B, 24C and 24D show an IC structure therefor, (A) being a pattern plan view, and (B), (C) and (D) being views in section taken along the line b—b, line c—c and line d—d, respectively, in (A)
Figure 24B:
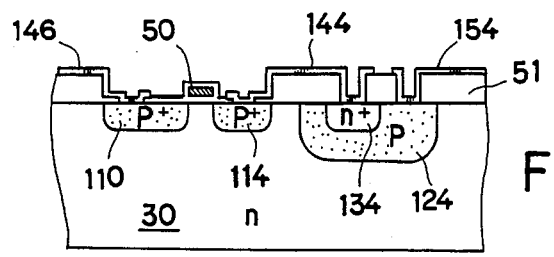
Figure 24C:
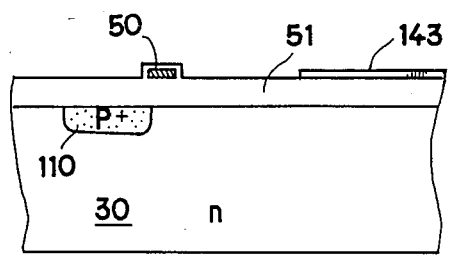
Figure 24D:
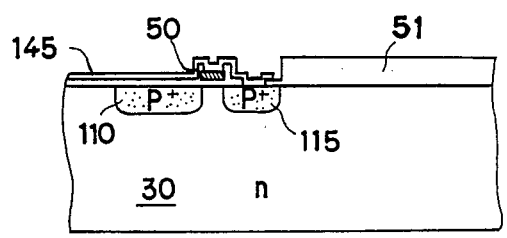

The multiple fan-out circuit can be further developed into a multi-output bounded-difference circuit as seen in FIG. 23. A multi-output current mirror 80 (for giving four outputs for a simplified description) has output drains which are connected to wired OR 7m1 to 7m4 each at one input portion thereof. These wired OR's 7m1 to 7m4 are connected, each at the other input portion thereof, to input terminals 91 to 94 and have an output side connected to output terminals 101 to 104 via diodes 81 to 84 The input currents to the input terminals 91 to 94 are indicated at Ix1 to Ix4, and the output currents of the output terminals 101 to 104 at Iz1 to Iz4. In corresponding relation to Expression (3), the following output currents are obtained.

$$Izn = \begin{cases} Ixn - Iy & (Ixn > Iy) \\ 0 & (Ixn \leq Iy) \end{cases} \quad (44)$$

where n=1 to 4.

The circuit of FIG. 23 performs operation for four kinds of bounded differences at the same time. This means that when the membership function $\mu y$ is definite and the other membership function $\mu xn$ is variable, the operation for $\mu xn \ominus y$ can be performed for a multiplicity of values $\mu xn$ at the same time. This means an increased operation speed and means that scanning of $\mu xn$ with time can be omitted.

If Ix1=Ix2=Ix3=Ix4=Ix the circuit of FIG. 23 is equivalent to the circuit of FIG. 22.

The multi-output bounded-difference circuit of FIG. 23 can be fabricated into an IC with the structure shown in FIG. 24. An n-type base plate 30 is provided thereon with a p-region 110, with which an Al pattern 146 is in ohmic contact, whereby a source is formed for a multi-output current mirror 80. The p-region 110 has five projections. Five other p-regions 111 to 115 are opposed to the projections as spaced apart therefrom a suitable distance. The channels formed between the projections of the p-region 110 and the p-regions 111 to 115 are identical in width and length. A polycrystal Si portion 50 serving as a gate is so disposed as to oppose the space between the p-region projections and the p-regions 111 to 115. Connected to the Si 50 is an Al pattern 145 providing an input drain. The Al pattern 145 is in ohmic contact with the p-region 115. Diodes 81 to 84 comprise p-regions 121 to 124 and n-regions 131 to 134, respectively. Al patterns 141 to 144 are connected to the n-regions 131 to 134, respectively. Al patterns 151 to 154 connected to output terminals 101 to 104, respectively, are connected to the p-regions 121 to 124.

Figure 25:
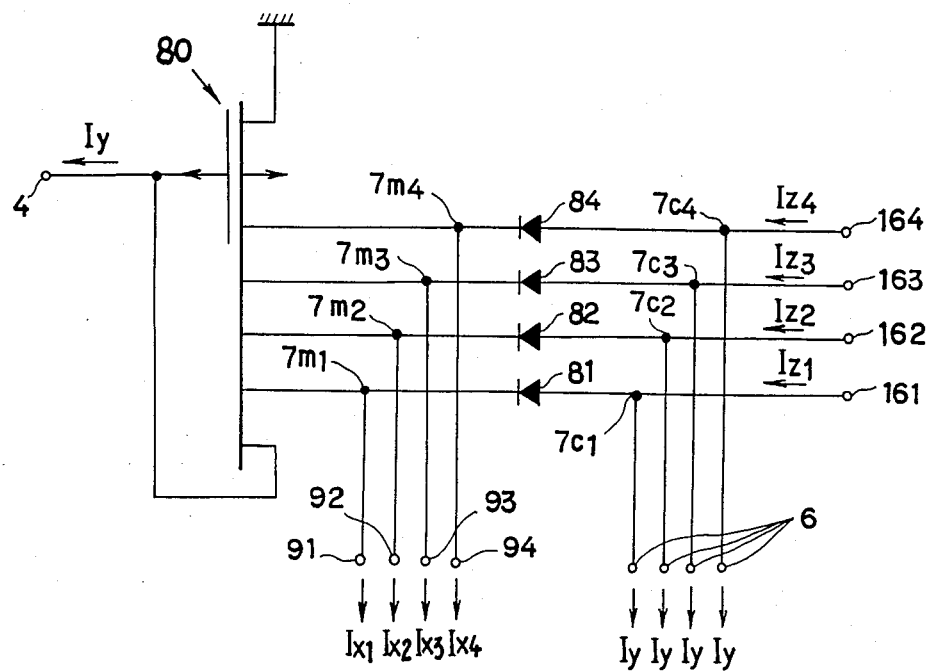
FIG. 25 is a diagram showing a logic union circuit including the multi-output bounded-difference circuit.

FIG. 25 shows a multi-output bounded-difference circuit as used for the logic union of FIG. 11. The bounded-difference circuit of FIG. 11 composed of the current mirror 1, diode 2 and wired OR 7 is replaced by the multi-output bounded-difference ciruit shown in FIG. 23. Input terminals 6 for supplying an input current Iy are connected (wired OR's 7c1 to 7c4) to the anodes of diodes 81 to 84. Input currents Iy of equal value can be supplied to four input terminals 6 and input terminals 4 with use of the above current distributor (FIG. 20). It will be readily understood with reference to Expression (19) that output terminals 161 to 164 deliver a logic union output which is given by the following expression.

$$Iz = Ixn \cup Iy \quad (45)$$
$$= \begin{cases} Ixn & (Ixn > Iy) \\ Iy & (Ixn \leq Iy) \end{cases}$$

wherein x=1 to 4.

The multi-output bounded-difference circuit is of course usable without the diodes 81 to 84 (FIG. 23).

(15) IC circuits consisting essentially of bounded-difference circuit

As already described, the basic operation circuit for the fuzzy logic can be composed of a bounded-difference circuit and a wired OR in combination. Accordingly, if a base plate has formed there on a logic array of bounded difference circuits in advance, a desired fuzzy logic operation circuit can be realized by designing an Al wiring pattern only.

Figure 26A:
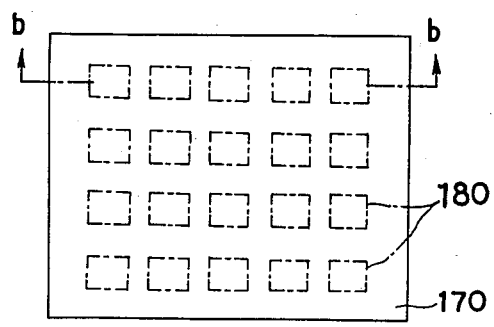
FIGS. 26A and 26B show an example of fuzzy IC, (A) being a plan view schematically showing the arrangement of the same, and (B) being a view in section taken along the line b—b in (A)
Figure 26B:
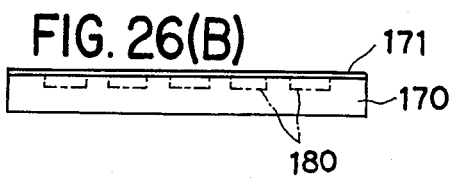

FIG. 26 shows a prefabricated IC having a multiplicity of basic circuit 180 formed on a base plate 170. Provided over the upper surface of the IC is a protective insulating film or layer formed with contact holes at suitable portions. A thin Al film 171, which is a conductor, is further formed over the protective film by vacuum evaporation. The upper surface of the IC may be entirely covered with a protective insulating film only instead of the combination of the two films. In principle, the basic circuit 180 is the basic element of the bounded-difference circuit (i.e. the circuit with the wiring removed therefrom). Since the diode preceding the current mirror can be omitted as already stated, the basic element of the current mirror (i.e. the mirror from which the wiring has been removed) is usable as the basic circuit 180. These two kinds of elements may be used.

For example, the manufacturer prepares such semifinished IC's to the user, who works on the IC by one to three steps to obtain a desired fuzzy logic circuit with use of a suitable wiring pattern. Thus, it is possible for the user to construct the desired logic circuit or system easily.

Figure 27:
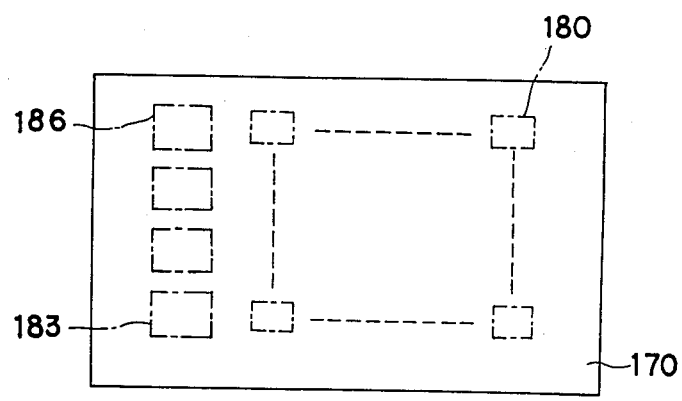
FIG. 27 is a plan view schematically showing another example.

Preferably, one base plate 170 is provided, in addition to base circuits 180, with a current distributor or multiple fan-out circuits 183 and 186 as seen in FIG. 27.

Figure 28:
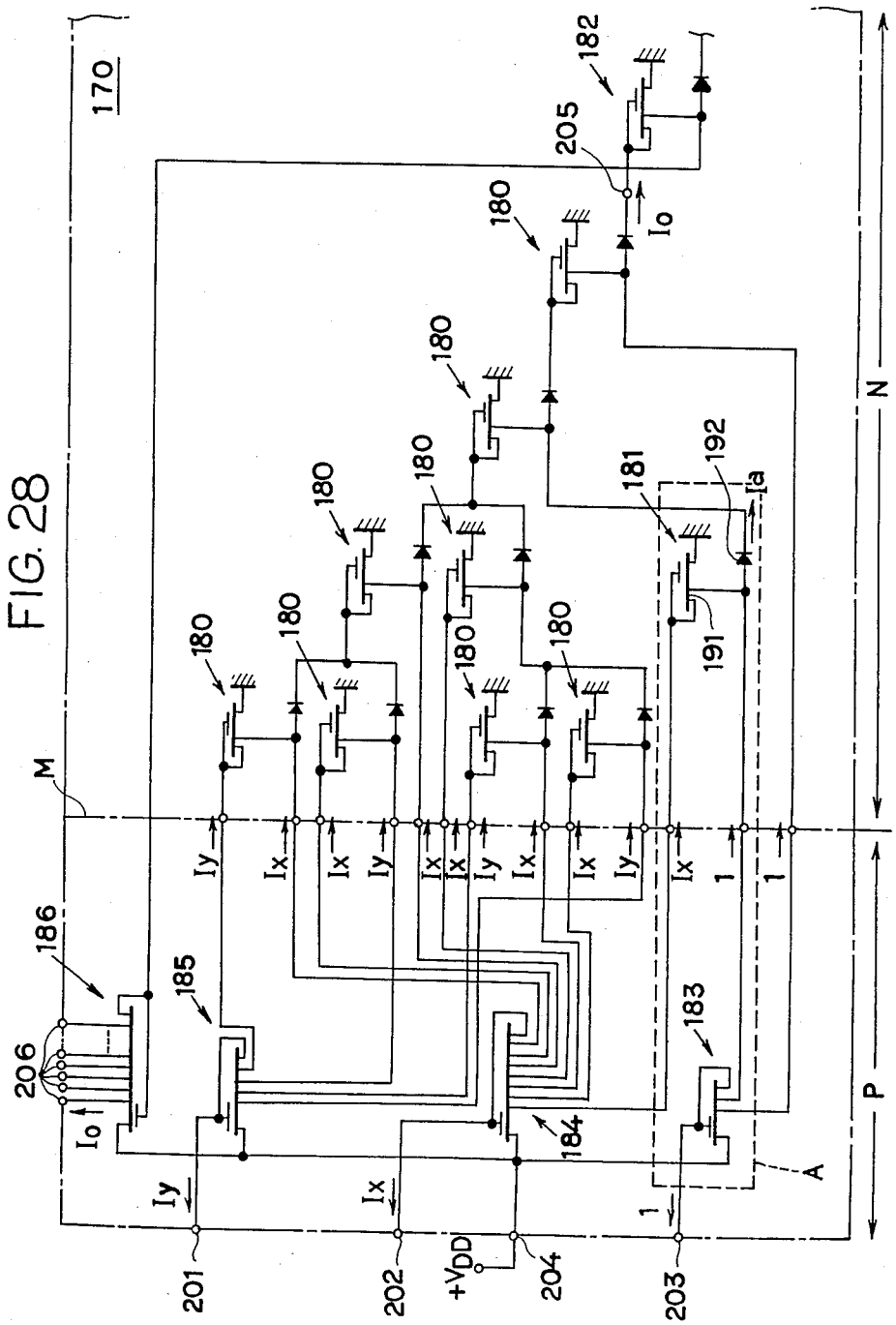
FIG. 28 is a diagram showing an example of fuzzy logic circuit.

FIG. 28 shows an example of fuzzy logic circuit which is prepared from a semifinished IC having a current distributor and multiple fan-out circuits as seen in FIG. 27 by wiring the components. Input currents Iy, Ix and a current with a value of 1 are given to input terminals 201, 202 and 203, respectively. A multiple fan-out circuit 185 provided on the base plate 170 produces a multiplicity of currents of a value equal to the input current Iy. Similarly, multiple fan-out circuits 184 and 183 produce currents of values equal to Ix and 1, respectively. Power supply voltage plus VDD is applied to a terminal 204 and further applied to the circuits 183 to 185.

Many bounded-difference circuits 180, 181 on the base plate 170, when suitably wired, provide a fuzzy logic circuit having a specified function (in the present case, not particularly limited). The output current of the multiple fan-out circuits 183 to 185 are fed to the fuzzy logic circuit, which delivers an output current Io at an output terminal 205 (not a specified terminal such as one for wiring bonding). The output current Io, which is flow-out output, is converted to a flow-in output with use of the current mirror of the circuit 182. The diode of the circuit 182 serves no function whatever. The cathode of the diode is left open. The flow-in output of the circuit 182 is fed to a multiple output circuit 186, by which a multiplicity of output currents Io having the same value are obtained. The output currents Io are delivered from terminals 206.

The circuits 183 to 186 comprise P-MOS, while the circuits 180 to 182 comprise N-MOS. In this way, various kinds of circuits can be provided on one base plate 170. It is of course possible to divide the assembly along a broken line M to provide the multiple fan-out circuits on one portion of the plate, and the bounded-difference circuits on the other portion.

Figure 29A:
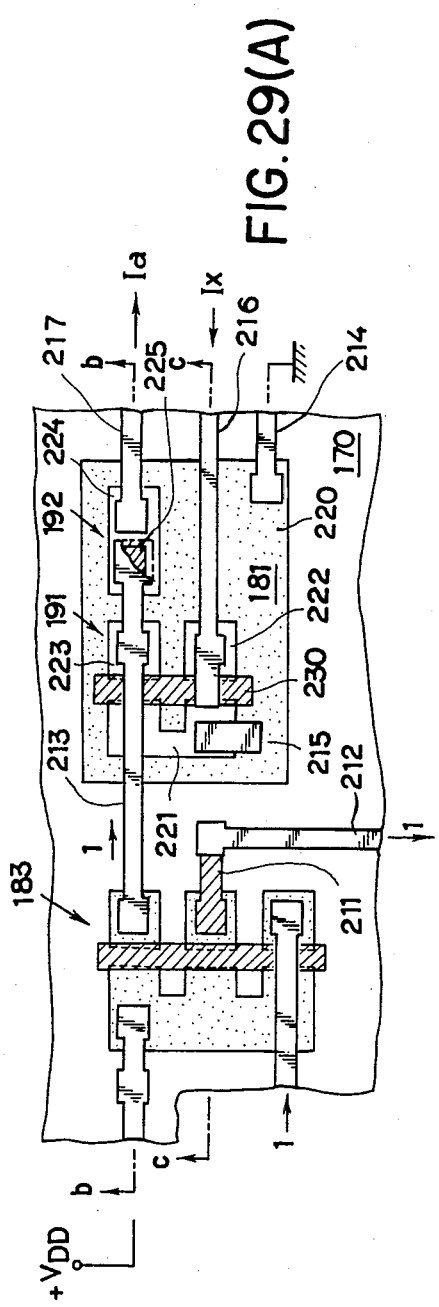
FIGS. 29A, 29B, 29C show part of an IC pattern therefor, (A) being a pattern plan view of the same partly broken away, and (B) and (C) are views in section taken along the line b—b and the line c—c, respectively, in (A)
Figure 29B:
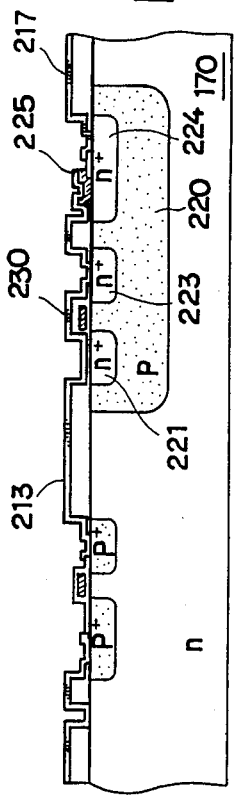
Figure 29C:
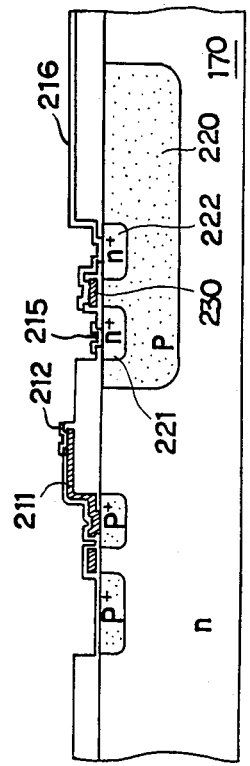

FIG. 29 shows a part of the circuit shown in FIG. 28, i.e. the portion enclosed by a broken line A and including the multiple fan-out circuit 183 and the bounded-difference circuit 181 in the form of an IC pattern. The IC is fabricated by polysilicon gate self-alignment P-MOS process. The base plate is of n-type. The circuit 183 has substantially the same construction as the multi-output current mirror indicated at 80 in FIG. 24 (A) except that one output drain comprises a double layer wiring of polysilicon 211 and Al pattern 212. The other output drain is connected to the circuit 181 by an Al pattern 213.

The bounded-difference circuit 181 is provided within a p-region 220, which is grounded by an Al pattern 214. An n-region 221 is connected to the p-region 220 by an Al pattern 215, constituting the source of the mirror 191. One of other n-regions, i.e. one indicated at 223, is connected to the Al pattern 213 (drain), while the other 222 is connected to polycrystal Si 230 serving as a gate and to an input Al pattern 216 (drain). A diode 192 comprises an n-region and p-type polycrystal Si 225. The polycrystal Si 225 is connected to the Al pattern 213, and the n-region 224 to an output Al pattern 217.

(16) Multi-functional fuzzy logic circuit

Figure 30:
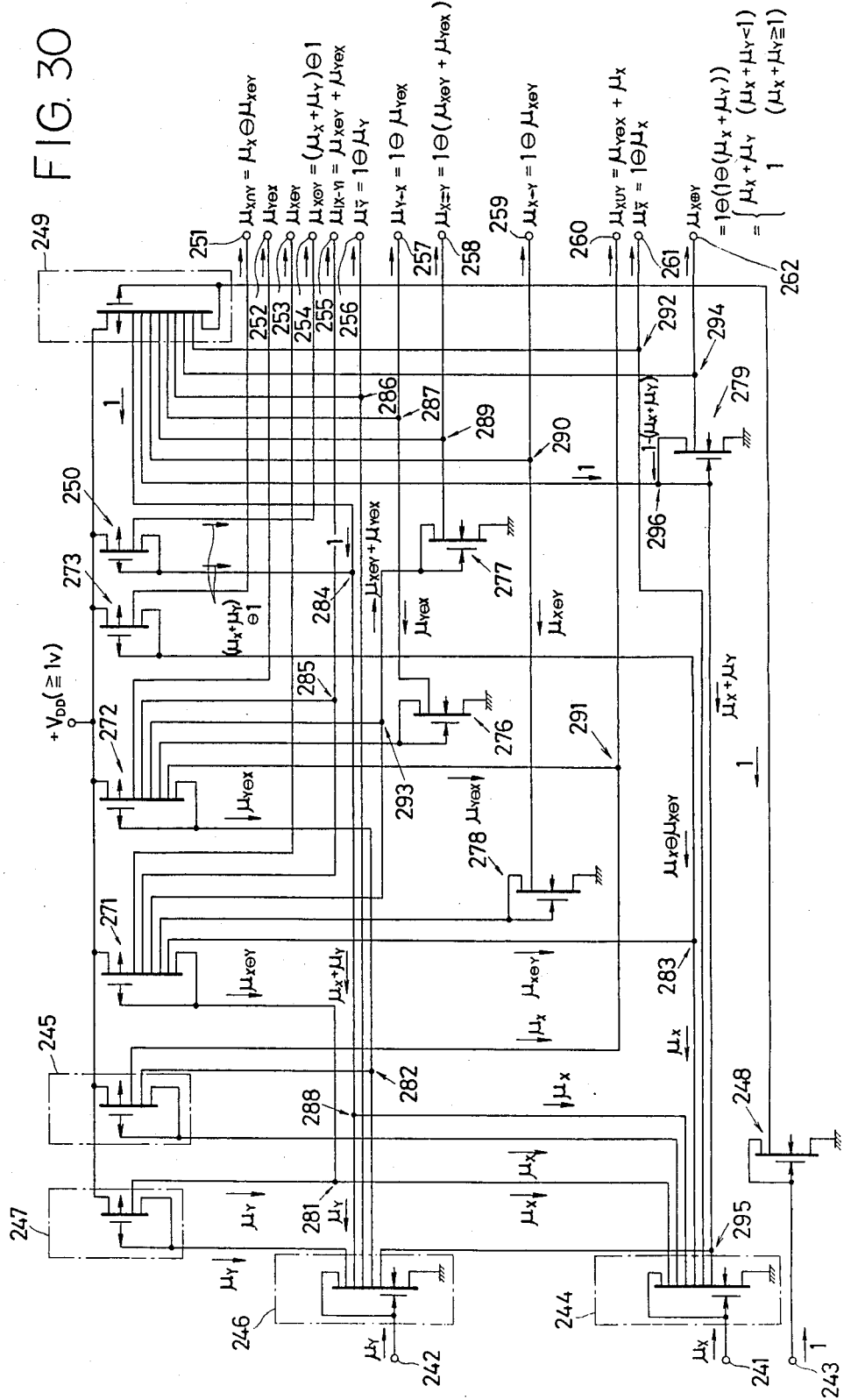
FIG. 30 is a diagram showing a multi-functional fuzzy logic circuit.

FIG. 30 shows a multi-functional fuzzy logic circuit fabricated on a base plate. The circuit may also be made by polysilicon gate self-alignment P-MOS process. Twelve fuzzy logic operations i.e. the bounded difference $\mu_{X\ominus Y}$ and $\mu_{Y\ominus X}$, complement $\mu_{\bar{X}}$ and $\mu_{\bar{Y}}$, bounded sum $\mu_{X\oplus Y}$, bounded product $\mu_{X\odot Y}$, logic union $\mu_{X\cup Y}$, logic intersection $\mu_{X\cap Y}$, absolute difference $\mu_{|X-Y|}$, implication $\mu_{X\to Y}$ and $\mu_{Y\to X}$, and equivalence $\mu_{X\rightleftharpoons Y}$ are merged in the circuit. A sign $\mu$ for membership function is used for representing a current in place of a sign I of current in FIG. 30 in order to make the drawing and description easily understandable.

Flow-in input currents $\mu_X$, $\mu_Y$ and 1 (current value corresponding to value 1 in fuzzy logic) are given to input terminals 241, 242 and 243 of the multi-functional fuzzy logic circuit on the base plate, respectively. Flow-out output currents representing the results of above twelve fuzzy logic operations are delivered from output terminals 251 and 262, respectively.

The current $\mu_X$ of the terminal 241 is fed to a multiple fan-out circuit (multi-output current mirror) 244 provided by an N-MOS to produce six currents $\mu_X$ of a value equal to find to and in a reverse direction to the input current. One of the output currents from the circuit 244 serves as a flow-out input current for a P-MOS multiple fan-out circuit 245, which delivers two output currents $\mu_X$ of the same value in the same direction as the input current to the terminal 241. Thus, two currents $\mu_X$ of the same value in the same direction as the input current of the terminal 241 and five currents $\mu_X$ of the same value as and in a reverse direction to the input current are available from the multiple fan-out circuits 244 and 245.

Similarly, multiple fan-out circuits 246 and 247 produce a current $\mu_Y$ having the same value and the same direction as the input current of the terminal 242 and four currents of a value equal to and in a reverse direction to the input current.

The current with a value of 1 given to the input terminal 243 is reversed in its direction by an N-MOS current mirror 248 to be fed a P-MOS multiple fan-out circuit 249. The circuit 249 supplies eight currents with the same value of 1 and the same direction as the input current fed to the terminal 243.

A multi-output bounded-difference circuit calculating $\mu_{X\ominus Y}$ comprises the multiple fan-out circuit 247, a wired OR 281 and a multi-output current mirror 271. The multiple-output bounded-difference circuit supplies five currents representing the operation results of an identical value $\mu_{X\ominus Y}$ and delivered from the multi-output current mirror 271 (flow-out output). The currents flowing into and out from the wired OR 281 will be considered. If $\mu_X > \mu_Y$, the current representing the difference ($\mu_X - \mu_Y$) flows into the wired OR 281 from the gate of multi-output current mirror 271 (the drain connected to the gate). If $\mu_X=\mu_Y$, the value of the current flowing into the wired OR 281 from the gate of the current mirror 271 will be of course equal to zero. If $\mu_X<\mu_Y$, since the current $(\mu_Y-\mu_X)$ being likely to flow into the multi-output current mirror 271 from the wired OR 281 is blocked by the current mirror 271 acting as a diode to a current of such direction, the current flowing from the wired OR 281 to the current mirror 271 will be zero. Thus the operation of bounded difference given by Expression (2) can be performed. The multi-output current mirror 271 acts as a diode as well as multiple fan-out circuit, which corresponds to the diode 2 and multiple fan-out circuit 71 in FIG. 22. One of the output currents from the multi-output current mirror 271 is fed to the output terminal 253 to become an output current representing the bounded difference $\mu_X\ominus_Y$. The other output currents is used for the other fuzzy logic operations.

Similarly, another multi-output bounded-difference circuit for the operation of bounded difference $\mu_Y\ominus_X$ comprises the multiple fan-out circuit 245, a wired OR 282 and a multi-output current mirror 272. The multi-output current mirror 272 produces five flow-out output currents $\mu_Y\ominus_X$, one of which is fed to the output terminal 252 and the others are used for the other operations.

The logic intersection $\mu_{X\cap Y}$ can be modified as $\mu_X\ominus(\mu_X\ominus\mu_Y)=\mu_X\ominus\mu_X\ominus_Y$ from Expression (22). The operation of logic intersection is performed by the operation of bounded difference between $\mu_X$ and $\mu_X\ominus_Y$, the bounded difference $\mu_X\ominus_Y$ being available from the multi-output current mirror 271. The above operation of bounded difference is executed by the circuit comprising the multi-output current mirror 271, a wired OR 283 and a current mirror 273 (acting as a diode). The current mirror 273 reverses the direction of the current representing the result of above operation to feed it to the output terminal 251.

The bounded product $\mu_{X\odot Y}$ is expressed as $(\mu_X+\mu_Y)\ominus 1$ as seen from Expression (11). The arithmetic sum $(\mu_X+\mu_Y)$ is calculated by a wired OR 288. The operation of bounded difference between $(\mu_X+\mu_Y)$ and 1 is executed by the combination of a current mirror 250 and wired OR 284. The current mirror 250 acting as a diode also has a function to reverse the direction of the output current to feed it to the output terminal 254.

Since the absolute difference $\mu_{|X-Y|}$ is expressed as sum of bounded differences $\mu_{X\ominus Y}$ and $\mu_{Y\ominus X}$ (see Expression (27)), this operation is realized by aforementioned bounded-difference circuits and a wired OR 285, the result of which is output from the output terminal 255.

The complement $\mu_{\bar Y}$ is bounded difference wherein $\mu_X=1$, i.e. $(1\ominus\mu_Y)$ see Expression (4)). This bounded difference circuit does not need a diode. Accordingly, the circuit for operation of bounded difference $(1\ominus\mu_Y)$ can be realized by combining the multiple fan-out circuit 246 and a wired OR 286 and the output current representing complement $\mu_{\bar Y}$ is fed to the output terminal 256.

In like manner, the output current representing complement $\mu_{\bar X}$ (the output terminal 261) is obtained from the bounded-difference circuit comprising the multiple fan-out circuit 244 and a wired OR 292.

The implication $\mu_{Y\to X}$ is equivalent to the bounded difference $(1\ominus\mu_{Y\ominus X})$ (see Expression (34)) and the bounded-difference circuit does not need a diode. The bounded-difference circuit for operation $(1\ominus\mu_{Y\ominus X})$ can be composed of a current mirror 276 and wired OR 287 and the output current thereof appears at the output terminal 257. Since N-MOS current mirror 276 is used, the direction of the output current is in reverse to that shown in FIG. 16.

Similarly, the implication $\mu_{X\to Y}$ (the output terminal 259) is performed by the circuit for the operation of bounded difference $(1\ominus\mu_{X\ominus Y})$ comprising a current mirror 278 and a wired OR 290.

The equivalence $\mu_{X\rightleftarrows Y}$ is expressed as $[1\ominus(\mu_{X\ominus Y}+\mu_{Y\ominus X})]$ (see Expression (40)). A wired OR 293 calculates $(\mu_{X\ominus Y}+\mu_{Y\ominus X})$. The circuit for the operation of bounded difference between 1 and $(\mu_{X\ominus Y}+\mu_{Y\ominus X})$ comprises a current mirror 277 and wired OR 289, in which a diode is omitted. The output current representing the operation of equivalence appears at the output terminal 258.

The operation of logic union $\mu_{X\cup Y}$ (the output terminal 260) is realized by the sum $(\mu_{Y\ominus X}+\mu_X)$ (see Expression (16)). The logic union circuit can be composed of the circuit for the operation of bounded difference $\mu_{Y\ominus X}$ and a wired OR 291.

The bounded sum $\mu_{X\oplus Y}$ expressed by Expression (6) or (7) is given by the following expression.

$$\mu_{x\oplus y}=\begin{cases}\mu x+\mu y & (\mu x+\mu y<1)\\ 1 & (\mu x+\mu y\geq 1)\end{cases} \quad (6)$$

The arithmetic sum $(\mu_X+\mu_Y)$ is calculated by a wired OR 295, the output current of which becomes the flow-out input to the gate of N-MOS current mirror 279 (the drain connected to the gate). One of output sides of multiple fan-out circuit 249 is connected to the gate (a wired OR 296) to which an input current having a value of 1 is fed. Accordingly, the input current given by the following Expression flows into the drain of the current mirror 279.

$$\begin{cases}1-(\mu x+\mu y) & (\mu x+\mu y<1)\\ 0 & (\mu x+\mu y\geq 1)\end{cases} \quad (46)$$

(Any flow-out current does not flow through the drain)

The drain output current of the current mirror (Expression (46)) is subtracted from the current having a value of 1 by a wired OR 294. The resultant current appears at the output terminal 262 as flow-out output, the current being given by:

$$\begin{cases}1-[1-(\mu x+\mu y)]=\mu x+\mu y\\ \qquad\qquad (\mu x+\mu y<1)\\ 1-0=1 \qquad (\mu x+\mu y\geq 1)\end{cases} \quad (47)$$

Expression (47) shows bounded sum.

The multi-functional fuzzy logic circuit shown in FIG. 30 includes a reduced number of elements (e.g. number of drains) as compared with that comprising twelve different fuzzy logic circuits fabricated individually, because many multiple fan-out circuits (multi-output current mirrors) are provided and an effect of (multi-output) current mirror acting as an diode is utilized in the circuit of FIG. 30.

The multi-output current mirrors 247, 245, 271, 272, 273, 250 and 249 have different numbers of drains with respect to each other in FIG. 30, each of the current mirrors being of P-MOS type. Circuit design will be very complicated when so many multi-output current mirrors having different number of drains are fabricated on a base plate together. Preferably each current mirror has the same number of drains as the others. As the result, the identical elements can be formed on the IC board in its manufacturing process and only the manner of connection between elements may be taken into consideration in a patterning process. Accordingly, the design of an IC board manufacturing process is simplified.

Figure 31:
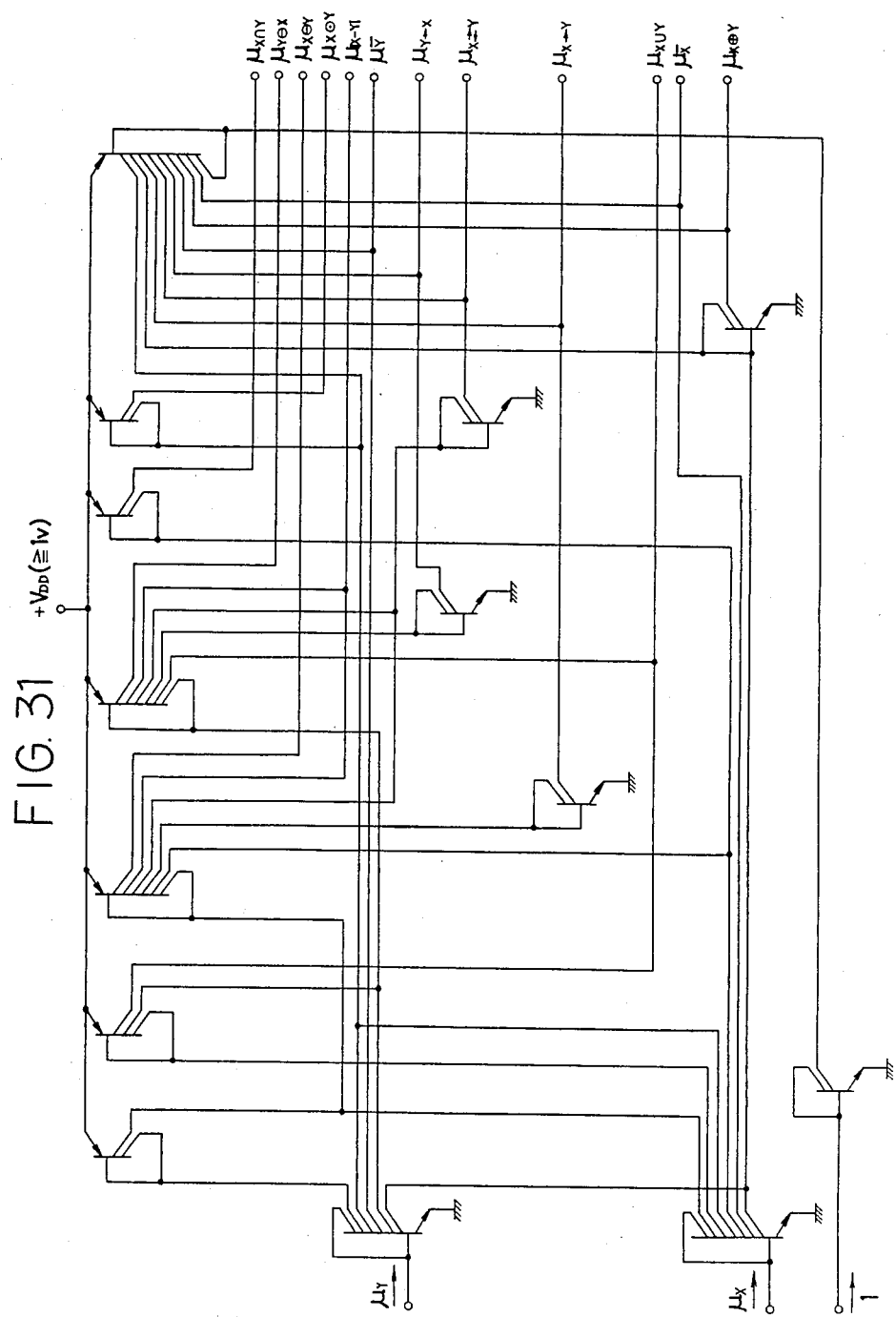
FIG. 31 is a diagram showing another multi-functional fuzzy logic circuit.

FIG. 31 shows another embodiment of a multi-functional fuzzy logic circuit. In this circuit, current mirrors comprising bipolar p-n junction transistors and multi-output current mirrors comprising bipolar p-n junction transistors are used in place of FET current mirrors and FET multi-output current mirrors of FIG. 30. These transistor current mirrors and multi-output current mirrors are composed of multi-collector transistors having at least two collectors. As described above, current mirrors comprising bipolar elements show their ordinal function acting as an current mirror only when the current amplification factor $\beta$ is very great.

What is claimed is:

1. A multi-functional fuzzy logic circuit comprising:
    at least one input circuit, to which at least one input current is fed, for producing at least one output current of the same value in the same direction as the input current and at least one output current of the same value in the reverse direction, and
    a plurality of fuzzy logic circuits for executing different fuzzy logic operations, each of said fuzzy logic circuits having as its input at least one of said output currents produced by said at least one input circuit.

2. A multi-functional fuzzy logic circuit as defined in claim 1 wherein said input circuit comprides a one-output current mirror or a multi-output current mirror, or a combination of a one-output current mirror and a multi-output current mirror.

3. A multi-functional fuzzy logic circuit as defined in claim 1 wherein said input circuit and said fuzzy logic circuits are integrally fabricated on a base plate.

4. A multi-functional fuzzy logic circuit comprising:
    first and second input circuits, to which first and second input currents representing different operation variables of fuzzy logic are fed, respectively, each of said input circuits producing at least one output current of the same value in the same direction as the input current and at least one output current of the same value in the reverse direction and comprising a one-output current mirror or a multi-output current mirror, or a combination of a one-output current mirror and a multi-output current mirror,
    a multi-output bounded-difference circuit comprising one of said input circuits, a wired OR for calculating the difference between the output current from said one of said input circuits and the output current from the other of said input circuits, and a multi-output current mirror having as its input the output current from said wired OR, and
    a plurality of different fuzzy logic circuits to each of which at least one of the output currents from said first and second input circuits and from said multi-output bounded-difference circuit is fed.

5. A multi-functional fuzzy logic circuit as defined in claim 4 further comprising:
    another multi-output bounded-difference circuit comprising the other of said input circuits, another wired OR for calculating the difference between the output current from the other of said input circuits and the output current from said one input circuit, and a multi-output current mirror having as its input the output current from said another wired OR.

6. A multi-functional fuzzy logic circuit as defined in claim 4 wherein said first and second input circuits, said multi-output bounded-difference circuit and said plurality of fuzzy logic circuits are integrally fabricated on a base plate.

7. A multi-functional fuzzy logic circuit as defined in claim 4 further comprising:
    a third input circuit, to which an input current representing 1 according to fuzzy logic is fed, for producing at least one output current having a value of 1 and a desired direction, and
    said plurality of different fuzzy logic circuits to each of which at least one of the output currents from said first, second and third input circuits or said multi-output bounded-difference circuit is fed.

* * * * *